(12) United States Patent
Chiang

(10) Patent No.: US 11,349,025 B2
(45) Date of Patent: May 31, 2022

(54) MULTI-CHANNEL DEVICE TO IMPROVE TRANSISTOR SPEED

(71) Applicant: Taiwan Semiconductor Manufacturing Co., Ltd., Hsin-Chu (TW)

(72) Inventor: Hsin-Chih Chiang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 716 days.

(21) Appl. No.: 16/227,277

(22) Filed: Dec. 20, 2018

(65) Prior Publication Data

US 2020/0135921 A1   Apr. 30, 2020

Related U.S. Application Data

(60) Provisional application No. 62/753,282, filed on Oct. 31, 2018.

(51) Int. Cl.
*H01L 29/78* (2006.01)
*H01L 29/10* (2006.01)
(Continued)

(52) U.S. Cl.
CPC ...... *H01L 29/7831* (2013.01); *H01L 29/0847* (2013.01); *H01L 29/1033* (2013.01);
(Continued)

(58) Field of Classification Search
CPC ....... H01L 29/66818; H01L 21/823821; H01L 27/0924; H01L 29/7727; H01L 29/1037;
(Continued)

(56) References Cited

U.S. PATENT DOCUMENTS 9,735,233 B2 *  8/2017  Heo ................. H01L 29/78
10,734,384 B1 *  8/2020  Li .................. H01L 21/823821
(Continued)

OTHER PUBLICATIONS

Jankovic, et al. "High Sensitivity Dual-Gate Four-Terminal Magnetic Sensor Compatible With SOI FinFET Technology." IEEE Electron Device Letters, vol. 38, No. 6, Jun. 2017.
(Continued)

*Primary Examiner* — Maliheh Malek
(74) *Attorney, Agent, or Firm* — Eschweiler & Potashnik, LLC

(57) ABSTRACT

In some embodiments, the present disclosure relates to a semiconductor device including a semiconductor region over a bulk oxide, which is over a semiconductor substrate. Above the bulk oxide is a lower source region that is laterally spaced from a lower drain region by a lower portion of the semiconductor region. An upper source region is laterally spaced from an upper drain region by an upper portion of the semiconductor region and is vertically spaced from the lower source region and the lower drain region. The upper source region is coupled to the lower source region, and the upper drain region is coupled to the lower drain region. A gate electrode, coupled to the semiconductor substrate and over a gate oxide, is above the upper portion of the semiconductor region. The lower and upper portions of the semiconductor region respectively include a first channel region and a second channel region.

20 Claims, 18 Drawing Sheets

(51) Int. Cl.
  *H01L 29/66* (2006.01)
  *H01L 29/423* (2006.01)
  *H01L 29/08* (2006.01)
(52) U.S. Cl.
  CPC .... *H01L 29/4238* (2013.01); *H01L 29/66484* (2013.01); *H01L 29/66666* (2013.01); *H01L 29/783* (2013.01); *H01L 29/7827* (2013.01)
(58) Field of Classification Search
  CPC ....... H01L 29/78687; H01L 21/823807; H01L 29/16–1608; H01L 29/22–2206; H01L 29/18–185; H01L 29/04–045; H01L 29/36–365
  See application file for complete search history.

(56) References Cited

U.S. PATENT DOCUMENTS

| | | | | |
|---|---|---|---|---|
| 10,734,391 | B2* | 8/2020 | Masuoka | H01L 21/8221 |
| 10,734,527 | B2* | 8/2020 | Ramaswamy | H01L 29/78642 |
| 10,741,663 | B1* | 8/2020 | Bao | H01L 21/823814 |
| 10,903,360 | B1* | 1/2021 | Hekmatshoartabari | G11C 11/1657 |
| 10,930,768 | B2* | 2/2021 | Hong | H01L 29/66545 |
| 10,937,911 | B2* | 3/2021 | Ramaswamy | H01L 21/02592 |
| 11,094,800 | B2* | 8/2021 | Son | H01L 29/1033 |
| 11,145,757 | B2* | 10/2021 | Jung | H01L 21/823885 |
| 11,164,870 | B2* | 11/2021 | Wu | H01L 21/02532 |
| 11,171,243 | B2* | 11/2021 | Dewey | H01L 29/7869 |
| 2015/0130032 | A1* | 5/2015 | Chiang | H01L 29/0619 257/657 |
| 2015/0145039 | A1* | 5/2015 | Lin | H01L 21/743 257/343 |
| 2016/0181422 | A1* | 6/2016 | Chiang | H01L 29/0626 257/339 |
| 2016/0260704 | A1* | 9/2016 | Huo | H01L 28/20 |
| 2016/0300886 | A1* | 10/2016 | Oh | H01L 29/0847 |
| 2017/0102353 | A1* | 4/2017 | Lei | G01N 27/128 |

OTHER PUBLICATIONS

Thornton, Scott. "Metal Oxide Field Effect Transistor: What is RDS(on)?" Published on May 5, 2017. Retrieved online on Dec. 20, 2018 from https://www.microcontrollertips.com/mosfets-what-is-rdson-faq/.

* cited by examiner

MULTI-CHANNEL DEVICE TO IMPROVE TRANSISTOR SPEED

REFERENCE TO RELATED APPLICATION

This Application claims the benefit of U.S. Provisional Application No. 62/753,282, filed on Oct. 31, 2018, the contents of which are hereby incorporated by reference in their entirety.

BACKGROUND

As technology advances at a rapid pace, engineers work to make devices smaller, yet more complex to improve and develop electronic devices that are more efficient, more reliable, and have more capabilities. One way to achieve these goals is by improving the design of transistors, as electronic devices comprise a plethora of transistors that together, carry out the function of the device. Overall electronic device performance may benefit from transistors that, for example, are smaller, consume less power, and have faster switching speeds.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
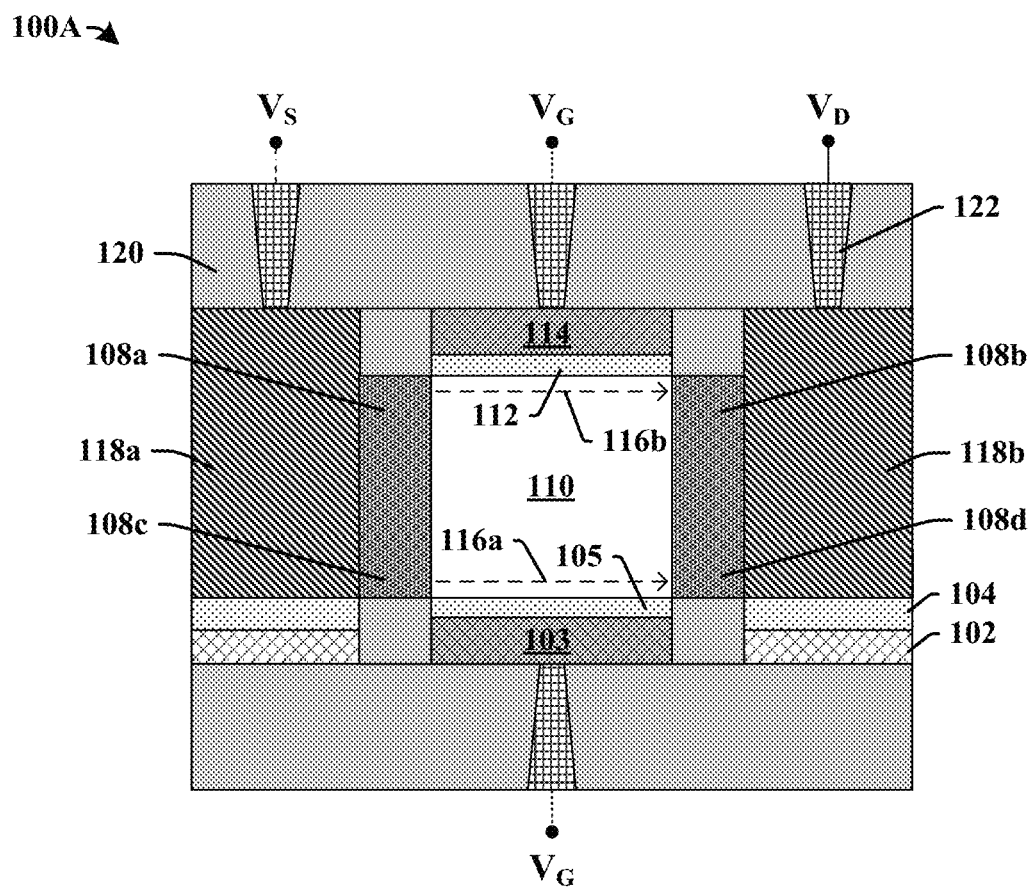
FIG. 1A-1D illustrate cross-sectional views of some embodiments of an integrated chip having a transistor comprising two channel regions.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A typical transistor in today's electronic devices includes a source and a drain formed within a semiconductor substrate, such that the source and drain are separated by a body region in the semiconductor substrate. The semiconductor substrate may be silicon on top of a bulk oxide and substrate, known as a silicon-on-insulator (SOI) substrate. The source and drain have a first doping type that is different than a second doping type of the body region. A gate electrode is arranged above the body region and separated from the body region by a gate oxide layer. The transistor turns ON when a voltage is applied to the gate electrode that is higher than a threshold voltage of the transistor. When the transistor turns ON, the voltage applied to the gate electrode causes a channel region to form within the body region between the source and drain. The channel region comprises mobile charge carriers that can flow from the source to the drain. To increase the switching speeds of the transistor, the amount of resistance within the channel region, known as the "drain-source on resistance", or $R_{DS(on)}$ can be reduced. However, there are many factors that influence the value of $R_{DS(on)}$, such as the channel region area, the diffusion resistance in the source and drain, the resistance of the substrate, and the temperature of the transistor. Adjusting these factors to improve transistor current may impose other functional and design challenges.

In the present disclosure, a new transistor design is presented that utilizes a SOI substrate to produce transistors with a lower $R_{DS(on)}$, thereby producing transistors with higher currents and faster switching speeds. The new transistor design has multiple channel regions that are arranged in electrical parallel with one another and are characterized by the same threshold voltage, and thus, conduct mobile charge carriers at the same current under the same conditions. Because the channel regions are arranged electrically in parallel with one another, the total resistance of the channel regions, $R_{DS(on)}$, is reduced. Advantageously, this new transistor design is achieved without substantially increasing the size of the transistor footprint on an integrated circuit.

FIG. 1A illustrates a cross-sectional view 100A of some embodiments of an integrated chip comprising a transistor with two channel regions.

The integrated chip from cross-sectional view 100A includes a bulk oxide 104 disposed over a semiconductor substrate 102. A semiconductor region 110 is arranged over the bulk oxide 104 and/or a patterned bulk oxide 105. The semiconductor region 110 is doped to a first doping type (e.g., n-type or p-type). Adjacent to corners of the semiconductor region 110 are an upper source region 108a, an upper drain region 108b, a lower source region 108c and a lower drain region 108d, which have a second doping type that is different from the first doping type. The upper source region 108a is laterally spaced from the upper drain region 108b by an upper portion of the semiconductor region 110. The lower drain region 108d is laterally spaced from the lower source region 108c by a lower portion of the semiconductor region 110. The lower source region 108c and the lower drain region 108d may have bottom surfaces that are arranged over and contact one or more inter-layer dielectric (ILD) layers 120. In some embodiments, the upper source region 108a is connected to the lower source region 108c, and the upper drain region 108b is connected to the lower drain region 108d.

Above the upper portion of the semiconductor region 110 is a gate oxide 112, and above the gate oxide 112 is a gate electrode 114. In some embodiments, the bulk oxide 104 and the gate oxide 112 have the same thickness and are made of the same material, such as a high-k dielectric or silicon dioxide, for example. Additionally, in some embodiments, the semiconductor substrate 102 and the gate electrode 114 are made of the same material, such as a conductive metal or doped polysilicon, for example. However, in other embodiments, the bulk oxide 104 is substantially thicker than the gate oxide 112. Additionally, in other embodiments, the semiconductor substrate 102 may be made of doped monocrystalline silicon, whereas the gate electrode 114 is made of doped polysilicon or a conductive metal. Thus, a back gate electrode 103 may be disposed within the semiconductor substrate 102 and a portion of the bulk oxide 104. The back gate electrode 103 may consist of the same material as the gate electrode 114, such as doped polysilicon or a conductive metal. The back gate electrode 103 may extend into a portion of the bulk oxide 104 such that the patterned bulk oxide 105 that is below the first channel region 116a is the same thickness as the gate oxide 112.

A first channel region 116a is within the lower portion of the semiconductor region 110, and a second channel region 116b is within the upper portion of the semiconductor region 110. The first channel region 116a may be structurally parallel to the second channel region 116b. The first channel region 116a and the second channel region 116b may be equal in length. The first channel region 116a and the second channel region 116b are the regions where mobile charge carriers flow when the transistor is ON.

A first metal contact 118a is electrically coupled to the upper source region 108a and lower source region 108c; and a second metal contact 118b is electrically coupled to the upper drain region 108b and the lower drain region 108d. In some embodiments (not shown), silicide layers are at the interface between the metal contacts 118a, 118b and the upper/lower source/drain regions 108a-d. The metal contacts 118a, 118b may have an upper surface that is substantially planar with the gate electrode 114. The metal contacts 118a, 118b are spaced from the gate electrode 114 and the back gate electrode 103 by the one or more ILD layers 120. Contact vias 122 couple the upper/lower source/drain regions 108a-d, the gate electrode 114, and the back gate electrode 103 to their respective voltage lines. The contact vias 122 are embedded in the one or more ILD layers 120.

The gate electrode 114 and the back gate electrode 103 are electrically coupled to a gate voltage line $V_G$. A circuit is coupled to the gate voltage line $V_G$ to concurrently provide the same voltage to the gate electrode 114 and the back gate electrode 103. The upper source region 108a and the lower source region 108c are electrically coupled to a source voltage line $V_S$. The upper drain region 108b and the lower drain region 108d are electrically coupled to a drain voltage line $V_D$. In order for the transistor in the integrated chip from cross-sectional view 100A to function at a lower $R_{DS(on)}$, the embodiment is designed such that the first channel region 116a and the second channel region 116b are characterized by the same threshold voltage. Thus, when a voltage greater than the threshold voltage is applied to the gate voltage line $V_G$ via the circuit, the transistor in the integrated chip from cross-sectional view 100A is ON, such that the first channel region 116a and the second channel region 116b allow mobile charge carriers to move respectively from the lower/upper source regions 108c, 108a to the lower/upper drain regions, 108d, 108b. Advantages to the embodiment in cross-sectional view 100A are a result of the presence of a first and second channel region 116a, 116b that are essentially arranged electrically in parallel, overall reducing $R_{DS(on)}$ and thus, increasing transistor switching speeds.

Figure 1B:
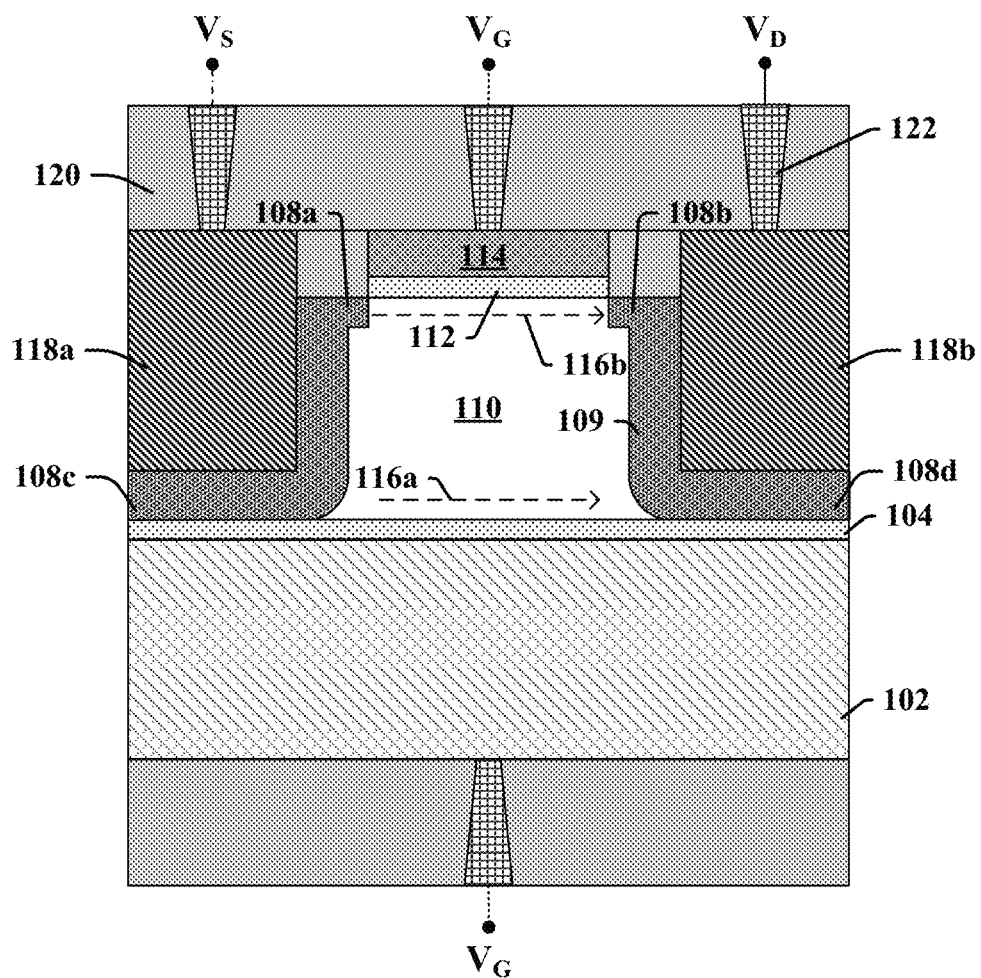

FIG. 1B illustrates an additional embodiment of a cross-sectional view 100B of an integrated chip comprising a transistor with two channel regions.

The integrated chip from cross-sectional view 100B includes the same features as the integrated chip from cross-sectional view 100A, but with different characteristics. In some embodiments, the lower source region 108c and the lower drain region 108d may be separated from the semiconductor substrate 102 by the bulk oxide 104. In some embodiments, residual source/drain areas 109 may connect the upper source region 108a to the lower source region 108c and the upper drain region 108b to the lower drain region 108d. In other embodiments (not shown), residual source/drain areas 109 may be omitted such that the upper source/drain regions 108a, 108b are respectively spaced apart from the lower source/drain regions 108c, 108d by the semiconductor region 110. The upper source region 108a may be vertically spaced from the lower source region 108c, and the upper drain region 108b may be vertically spaced from the lower drain region 108d. In some embodiments, the upper source/drain regions 108a, 108b may be smaller in length and/or thickness than the lower source/drain regions 108c, 108d, respectively. In many embodiments, the first channel region 116a and the second channel region 116b are substantially the same length. This may be achieved by adjusting the location of the lower source region 108c and the lower drain region 108d. The lower source region 108c and the lower drain region 108d may be formed by ion implantation into the semiconductor region 110. The ion implantation angle can be tuned to reduce the length of the first channel region 116a. Thus, the residual source/drain areas 109 may connect to the lower source region 108c and the lower drain region 108d at a rounded corner. In some embodiments, the residual source/drain areas 109 may be the same thickness as the lower source region 108c and the lower drain region 108d.

In many embodiments, the bulk oxide 104 and the gate oxide 112 have the same thickness and are made of the same material, such as a high-k dielectric or silicon dioxide, for example. Additionally, in some embodiments, the semiconductor substrate 102 and the gate electrode 114 are made of the same material, such as a conductive metal or doped polysilicon, for example. Thus, the voltage gate line $V_G$ is coupled to the semiconductor substrate 102 and the gate electrode 114.

Due to these design features of the transistor in the integrated chip from cross-sectional view 100B, when a voltage applied to the gate voltage line $V_G$ is above the threshold voltage, both the first channel region 116a and the second channel region 116b comprise mobile charge carriers moving at the same current respectively from the lower/upper source regions 108c, 108a to the lower/upper drain regions 108d, 108b, such that the transistor is ON. In many embodiments, the channel regions 116a, 116b may have a length that is in a range of between approximately 0.3 micrometers and approximately 2 micrometers. In some embodiments the threshold voltage may be in the range of between approximately 5 volts and approximately 8 volts.

Figure 1C:
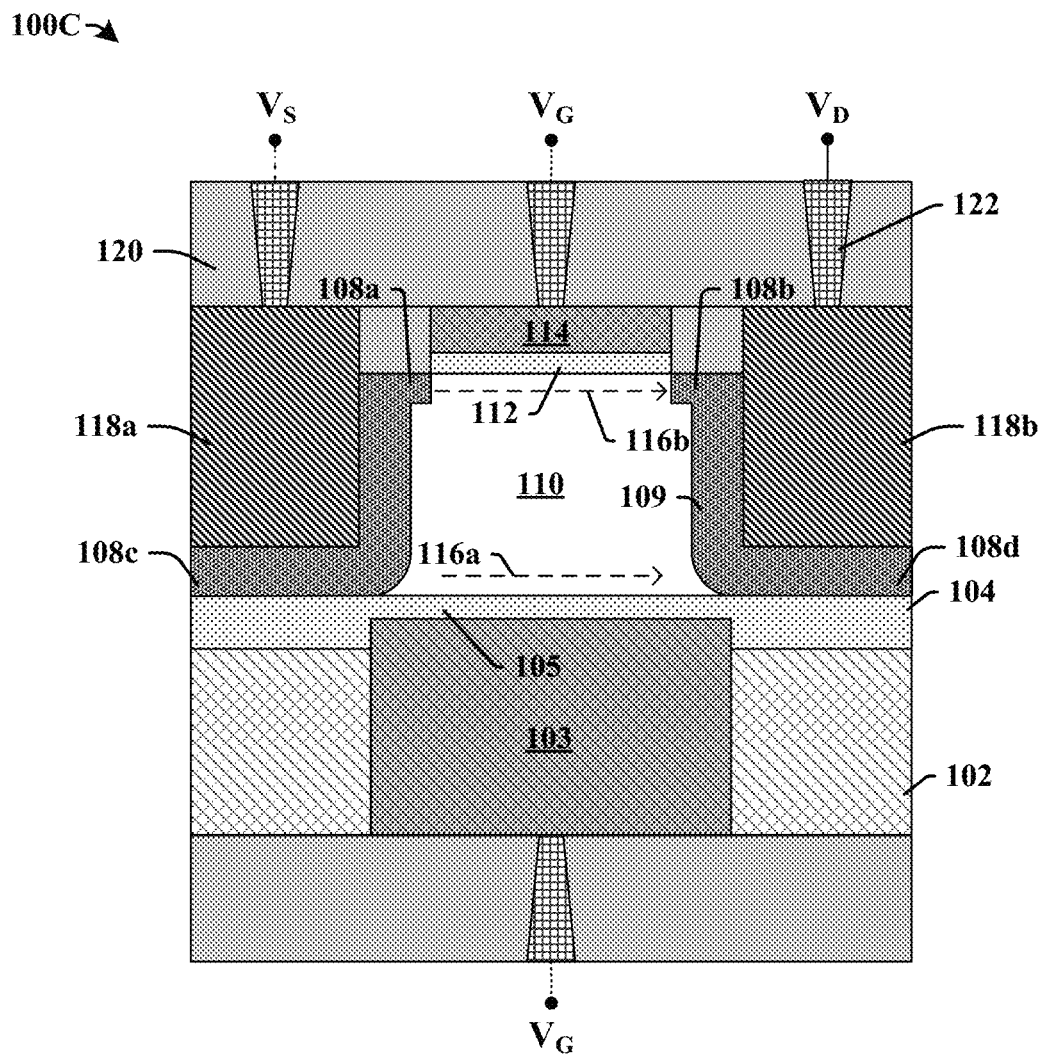

FIG. 1C illustrates an additional embodiments of a cross-sectional view 100C of an integrated chip comprising a transistor with two channels.

The integrated chip from cross-sectional view 100C includes the same features as the integrated chip from cross-sectional view 100B, and an additional feature, the back gate electrode 103 disposed within the semiconductor substrate 102. The back gate electrode 103 consists of the same material as the gate electrode 114, such as doped polysilicon or a conductive metal, for example. The back gate electrode 103 may consist of a different material than the semiconductor substrate 102. The semiconductor substrate 102 may consist of, for example, monocrystalline silicon. In cross-sectional view 100C, the bulk oxide 104 is thicker than the gate oxide 112. The back gate electrode 103 may extend into a portion of the bulk oxide 104 below the first channel region 116a such that the patterned bulk oxide 105 is the same thickness as the gate oxide 112.

Figure 1D:
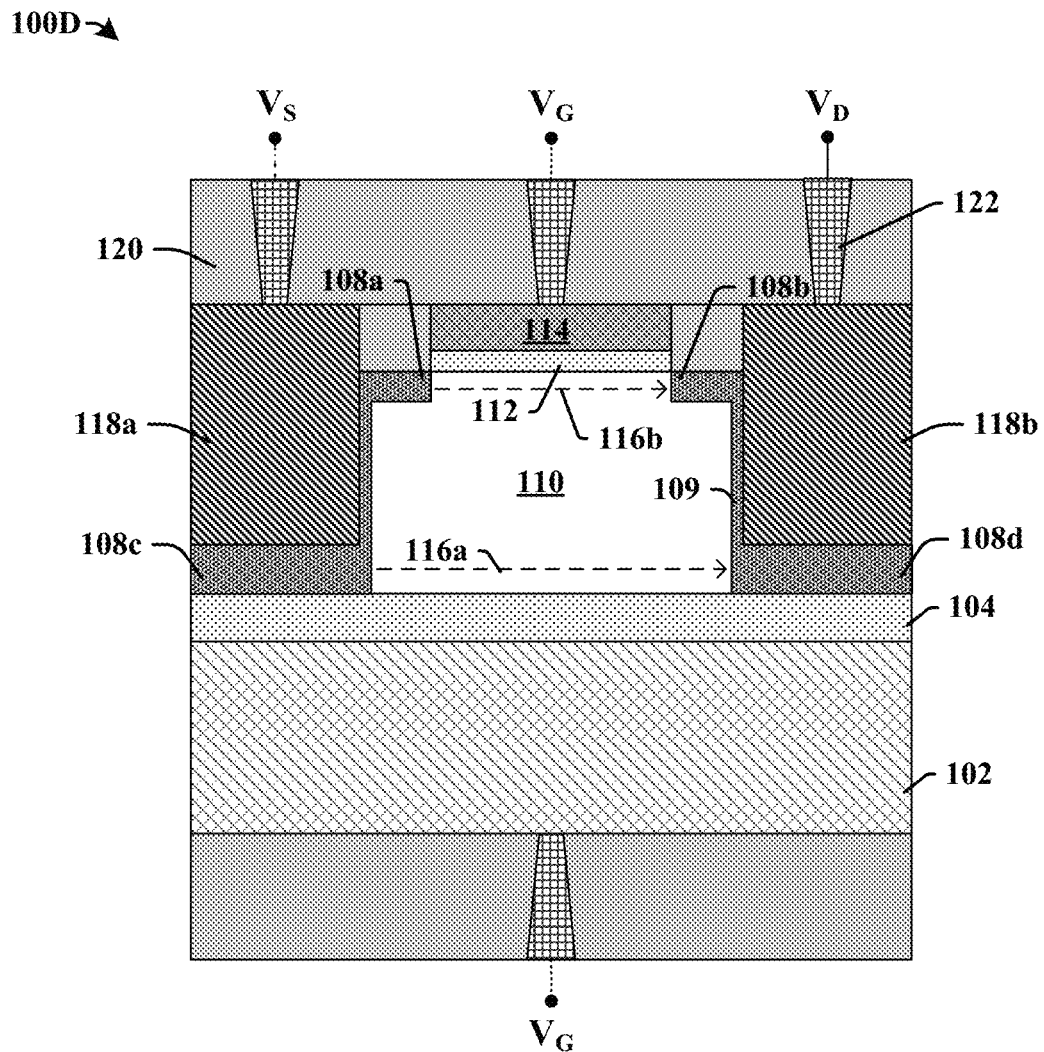

FIG. 1D illustrates an additional embodiment of a cross-sectional view 100D of an integrated chip comprising a transistor with two channel regions.

The integrated chip from cross-sectional view 100C includes the same features as the integrated chip from cross-sectional view 100B, but with different characteristics. In cross-sectional view 100D, the bulk oxide 104 is thicker than the gate oxide 112. In some embodiments, the upper/lower source/drain regions 108a-108d are formed by a vertical ion implantation, causing the first channel region 116a to be longer than the second channel region 116b. Additionally, the residual source/drain areas 109 may have a smaller thickness than the lower source region 108c and the lower drain region 108d. In many embodiments, the semiconductor substrate 102 may be made of doped monocrystalline silicon, whereas the gate electrode 114 is made of doped polysilicon or a conductive metal, for example. In other embodiments, the semiconductor substrate 102 may consist of the same material as the gate electrode 114. Additionally, in other embodiments (not shown), the geometry and/or materials of the elements in FIG. 1D, such as the geometry of the semiconductor region 110, may be tuned in some embodiments to achieve a first channel region 116a and a second channel region 116b that have the same threshold voltage.

Figure 2A:
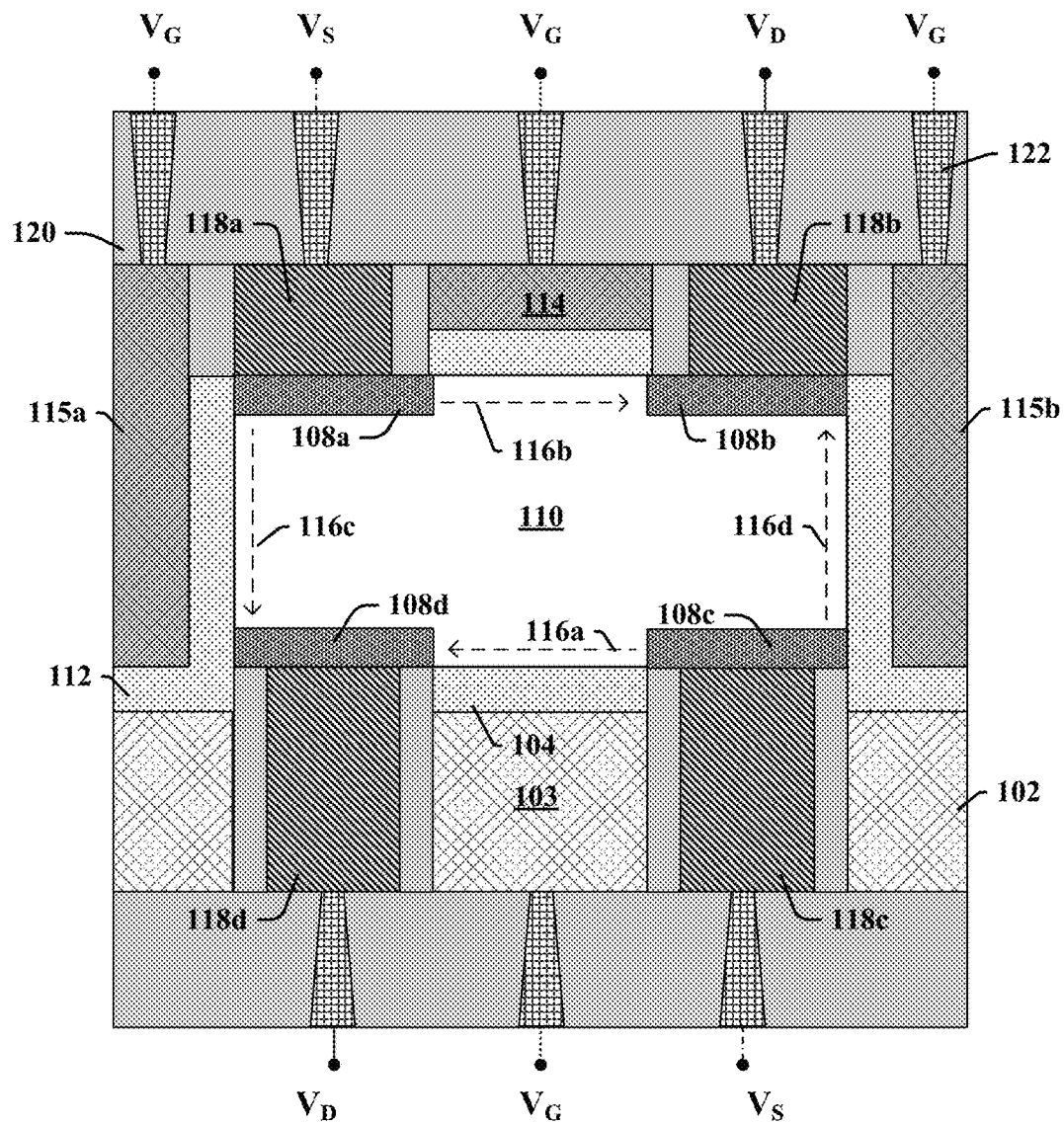
FIG. 2A-2B illustrates a cross-sectional view of some additional embodiments of an integrated chip having a transistor comprising four channel regions.

FIG. 2A illustrates a cross-sectional view 200A of some embodiments of an integrated chip comprising a transistor with four channel regions.

The integrated chip from cross-sectional view 200 includes a semiconductor substrate 102 comprising a back gate electrode 103. A bulk oxide 104 is arranged over the back gate electrode 103. A semiconductor region 110 is arranged above the bulk oxide 104. A lower drain region 108d is disposed in a first lower corner of the semiconductor region 110, and a lower source region 108c is disposed in a second lower corner of the semiconductor region 110. The lower drain region 108d is spaced from the lower source region 108c by a first channel region 116a. The first channel region 116a is within the semiconductor region 110 and overlies the bulk oxide 104. Above the lower drain region 108d is the upper source region 108a. A third channel region 116c is within the semiconductor region 110 and separates the upper source region 108a from the lower drain region 108d. An upper drain region 108b is laterally spaced from the upper source region 108a by a second channel region 116b and vertically spaced from the lower source region 108c by a fourth channel region 116d. In many embodiments, the first channel region 116a, the second channel region 116b, the third channel region 116c, and the fourth channel region 116d substantially have the same length. In many embodiments, the channel regions 116a-116d may have a length that substantially equal to one another and is in a range of between approximately 0.3 micrometers and approximately 2 micrometers.

Adjacent to the second channel region 116b, the third channel region 116c and the fourth channel region 116d is the gate oxide 112. In many embodiments, the gate oxide 112 and the bulk oxide 104 are made of the same material and have the same thickness, such as silicon dioxide or a high-k dielectric, for example. A first peripheral gate electrode 115a is arranged beside the upper source region 108a and the lower drain region 108d and is separated from the semiconductor region 110 by the gate oxide 112. A second peripheral gate electrode 115b is arranged beside the upper drain region 108b and the lower source region 108c and is separated from the semiconductor region 110 by the gate oxide 112. A gate electrode 114 is arranged above the second channel region 116b and is spaced from the semiconductor region 110 by the gate oxide 112. In some embodiments, the first peripheral gate electrode 115a, the second peripheral gate electrode 115b, and the gate electrode 114 have the same thickness. Additionally, the gate electrode 114, the first peripheral gate electrode 115a, and the second peripheral gate electrode 115b may be made of the same material such as a conductive metal or doped polysilicon, for example. Similarly, in many embodiments, the back gate electrode 103 and the semiconductor substrate 102 are made of the same material such as monocrystalline silicon. In some embodiments, the semiconductor substrate 102 and the back gate electrode 103 may also be made of the same material as the gate electrode 114 and the first and second peripheral gate electrodes 115a, 115b. In other embodiments, the semiconductor substrate 102 and the back gate electrode 103 may be made of doped monocrystalline silicon, whereas the gate electrode 114 and the first and second peripheral gate electrodes 115a, 115b may be made of doped polysilicon or of a conductive metal.

Metal contacts 118a-118d are electrically coupled to the upper source region 108a, the upper drain region 108b, the lower source region 108c and the lower drain region 108d. In some embodiments (not shown), silicide layers are at the interface between the metal contacts 118a-118d and the upper/lower source/drain regions 108a-d. In some embodiments, the metal contacts 118a, 118b that are coupled to the upper source region 108a and the upper drain region 108b have an upper surface that is substantially coplanar with upper surfaces of the gate electrode 114, the first peripheral gate electrode 115a and the second peripheral gate electrode 115b. Similarly, the metal contacts 118c, 118d that are coupled to the lower source region 108c and the lower drain region 108d have a lower surface that is substantially coplanar with lower surfaces of the semiconductor substrate 102 and the back gate electrode 103.

One or more inter-layer dielectric (ILD) layers 120 separate the metal contacts 118a-118d from the gate electrode 114, the first peripheral gate electrode 115a, the second peripheral gate electrode 115b, the semiconductor substrate 102, and the back gate electrode 103. Contact vias 122 are embedded within the one or more ILD layers 120. The contact vias 122 may comprises a conductive metal, such as aluminum, tungsten or copper, for example. The arrangement of the contact vias 122 may vary. For example, in some embodiments, as in the integrated chip from cross-sectional view 200, the contact vias 122 that are coupled to the first and second peripheral gate electrodes 115a, 115b may be arranged adjacent to the contact vias 122 that are coupled to the upper source and drain regions 108a, 108b. In other embodiments (not shown), the contact vias 122 that are coupled to the first and second peripheral gate electrodes 115a, 115b may be adjacent to the contact vias 122 that are coupled to the lower source and drain regions 108c, 108d.

A gate voltage line $V_G$, a source voltage line $V_S$, and a drain voltage line $V_D$ are coupled to one or more of the contact vias 122. The upper source region 108a and the lower source region 108c are electrically coupled to the source voltage line $V_S$. Similarly, the upper drain region 108b and the lower drain region 108d are electrically coupled to the drain voltage line $V_D$. The first peripheral gate electrode 115a, the second peripheral gate electrode 115b, the gate electrode 114 and the back gate electrode 103 are electrically coupled to the gate voltage line $V_G$. A circuit is coupled to the gate voltage line $V_G$ to concurrently provide the same voltage to the first peripheral gate electrode 115a, the second peripheral gate electrode 115b, the gate electrode 114 and the back gate electrode 103. There are many ways these voltage lines may be coupled to each component of the transistor in the integrated chip from cross-sectional view 200 such as through-substrate vias and/or package structures of a 3D integrated circuit die. The components of the transistor within the integrated chip from cross-sectional view 200 are designed such that when a gate voltage that is higher than the threshold voltage is applied to a gate voltage line $V_G$ via the circuit, all four channel regions 116a-116d are activated, such that the current across each channel region 116a-d is measured to be the same, thereby reducing the total $R_{DS(on)}$ of the transistor. In some embodiments the threshold voltage may be in the range of between approximately 5 volts and approximately 8 volts. Advantages to the embodiment in cross-sectional view 200 are a result of the presence of a first, second, third and fourth channel region 116a-d that are essentially arranged electrically in parallel, overall reducing $R_{DS(on)}$ and thus, increasing transistor switching speeds.

Figure 2B:
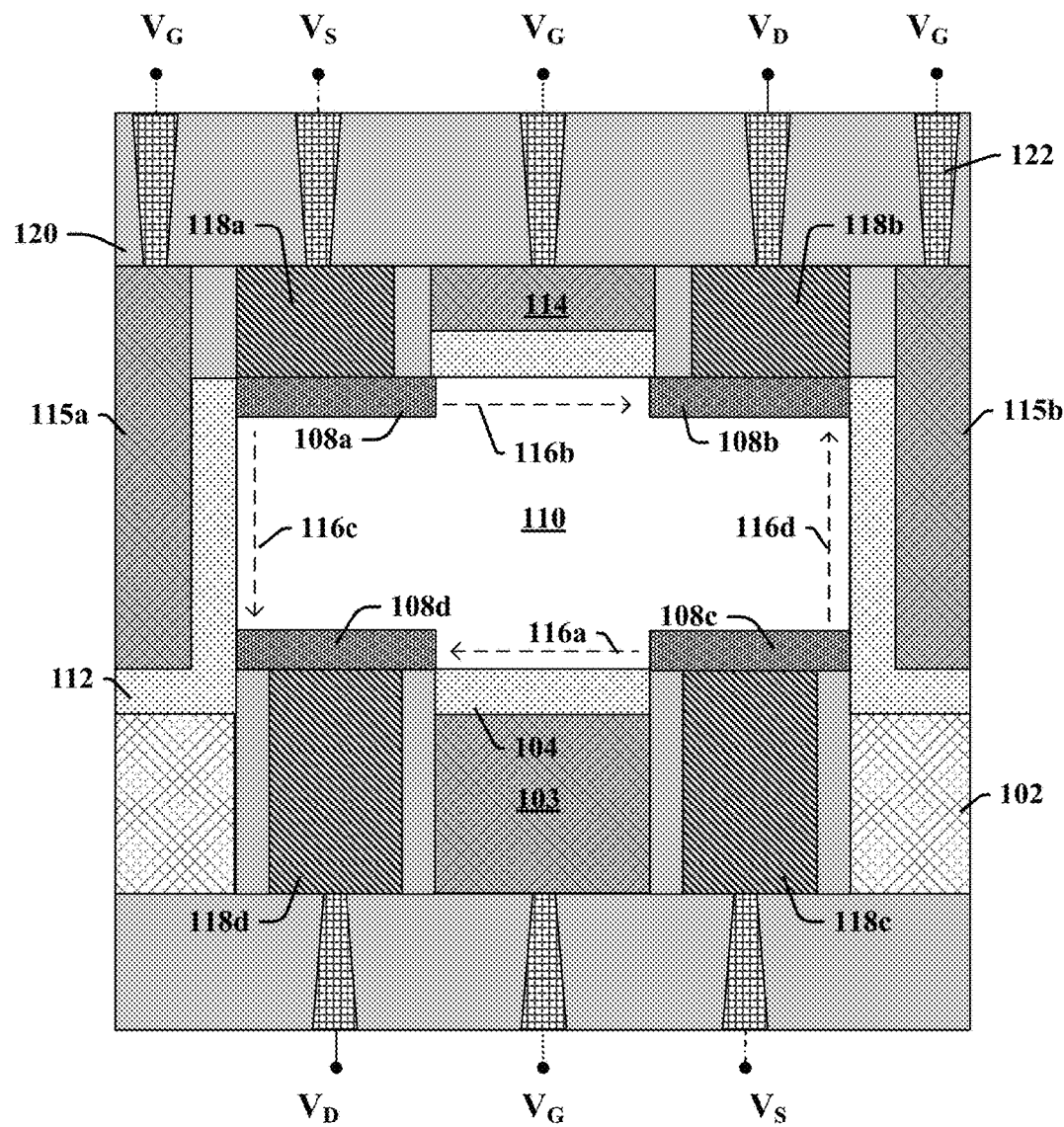

FIG. 2B illustrates an additional embodiment of a cross-sectional view 200B of an integrated chip comprising a transistor with four channel regions.

The integrated chip from cross-sectional view 200B includes the same features as the integrated chip from cross-sectional view 200B, but with different characteristics. In some embodiments, the semiconductor substrate 102 consists of a different material than the gate electrode 114, the first peripheral gate electrode 115a, and the second peripheral gate electrode 115b. Therefore, in some embodiments, the back gate electrode 103 that is disposed between the metal contacts 118c, 118d may consist of the same material as the gate electrode 114 and the first and second peripheral gate electrodes 115a, 115b. Thus, the back gate electrode 103 may consist of a different material than the semiconductor substrate 102. Advantageously, when the gate electrode 114, first peripheral gate electrode 115a, second peripheral gate electrode 115b, and back gate electrode 103 consist of the same material, such as doped polysilicon or a conductive metal, all four channel regions 116a-116d may be characterized by the same threshold voltage.

FIGS. 3-11 illustrate cross-sectional views 300-1100 of some embodiments of a method of forming an integrated chip having a transistor comprising two channel regions.

Although FIGS. 3-11 are described in relation to a method, it will be appreciated that the structures disclosed in FIGS. 3-11 are not limited to such a method, but instead may stand alone as structures independent of the method.

Figure 3:
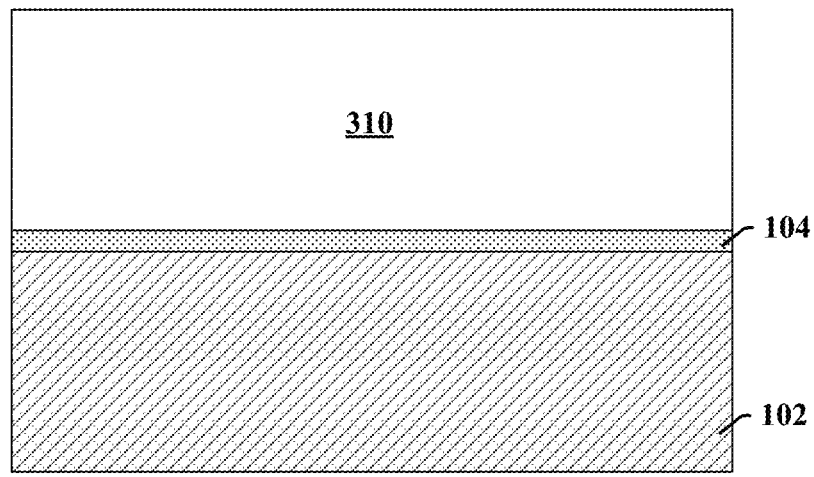
FIGS. 3-11 illustrate cross-sectional views of some embodiments of a method of forming an integrated chip having a transistor comprising two channel regions.

As shown in cross-sectional view 300 of FIG. 3, a silicon-on-insulator substrate is provided, comprising a semiconductor material 310 disposed over a bulk oxide 104 which is disposed over a semiconductor substrate 102. Additional processing steps may be performed to dope the semiconductor substrate 102, which is often made of monocrystalline silicon. The semiconductor material 310 has a first doping type (e.g., n-type or p-type).

Figure 4:
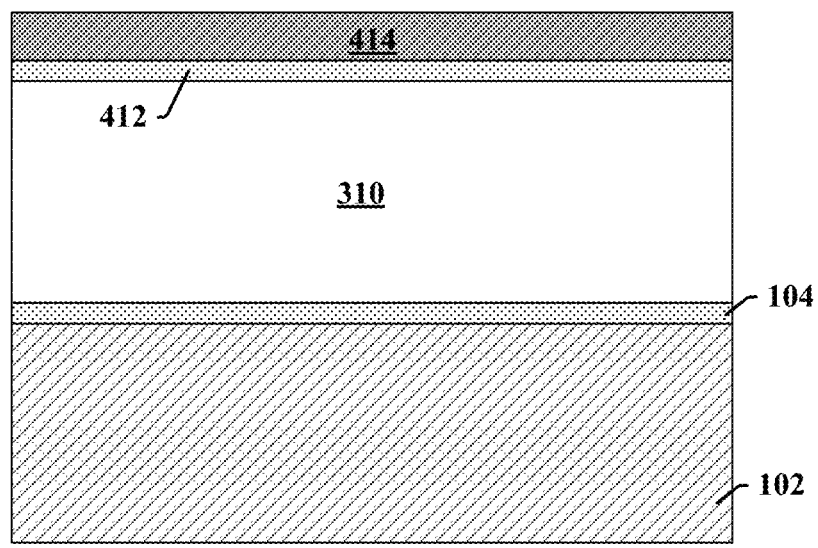

As shown in cross-sectional view 400 of FIG. 4, a gate electrode layer 414 over a gate oxide layer 412 is formed on the semiconductor material 310. In many embodiments, the gate oxide layer 412 is grown by a thermal oxidation process under high temperatures. The gate oxide layer 412 is formed to have a substantially uniform thickness. In many embodiments, the gate oxide layer 412 is grown to have a thickness that is equal to the thickness of the bulk oxide 104. Additionally, the gate oxide layer 412 is made of the same material as the bulk oxide 104. The gate electrode layer 414 may be formed by way of vapor deposition processes (e.g., CVD, PE-CVD, PVD, or ALD). The gate electrode layer 414 may comprise doped polysilicon. In some embodiments, the gate electrode layer 414 comprises the same material as the semiconductor substrate 102.

Figure 5:
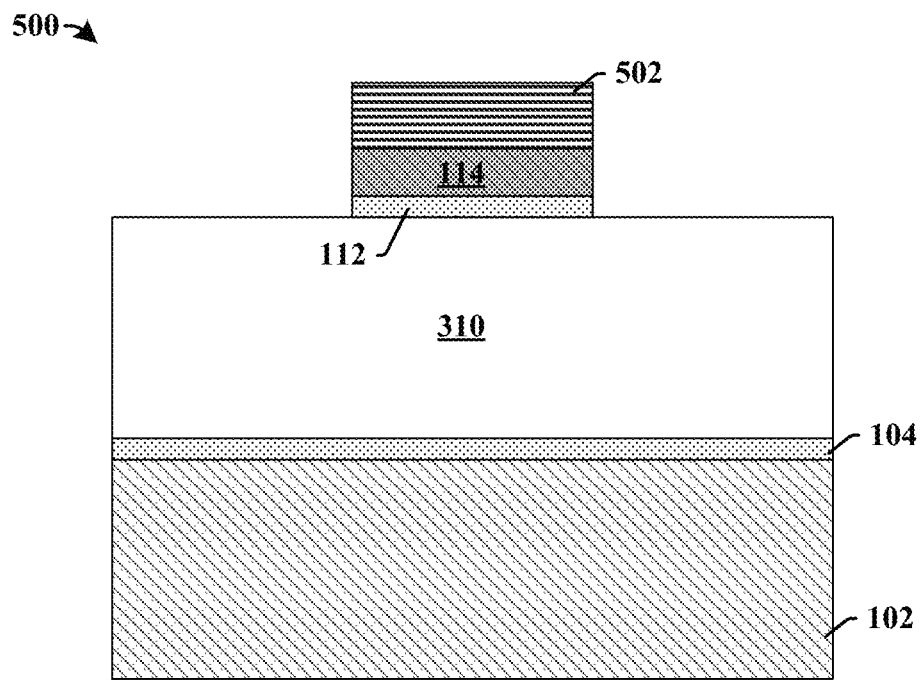

As shown in cross-sectional view 500 of FIG. 5, a patterned hard mask 502 is used to pattern the gate electrode layer 414 and the gate oxide layer 412 to form a gate electrode 114 and gate oxide 112. In some embodiments, the patterned hard mask 502 may comprise a photosensitive material (e.g., photoresist) formed by a spin coating process and patterned by a photolithography process. In other embodiments, the patterned mask 502 may comprise a hard mask layer (e.g., a silicon nitride layer, a silicon carbide layer, or the like). Uncovered portions of the gate electrode layer 414 and the gate oxide layer 412 are etched (e.g., wet etch or dry etch), such that the gate electrode 114 and the gate oxide 112 remain. The length of the patterned hard mask 502 may be in the range of between approximately 0.3 micrometers to approximately 2 micrometers. The patterned hard mask 502 may be removed.

Figure 6:
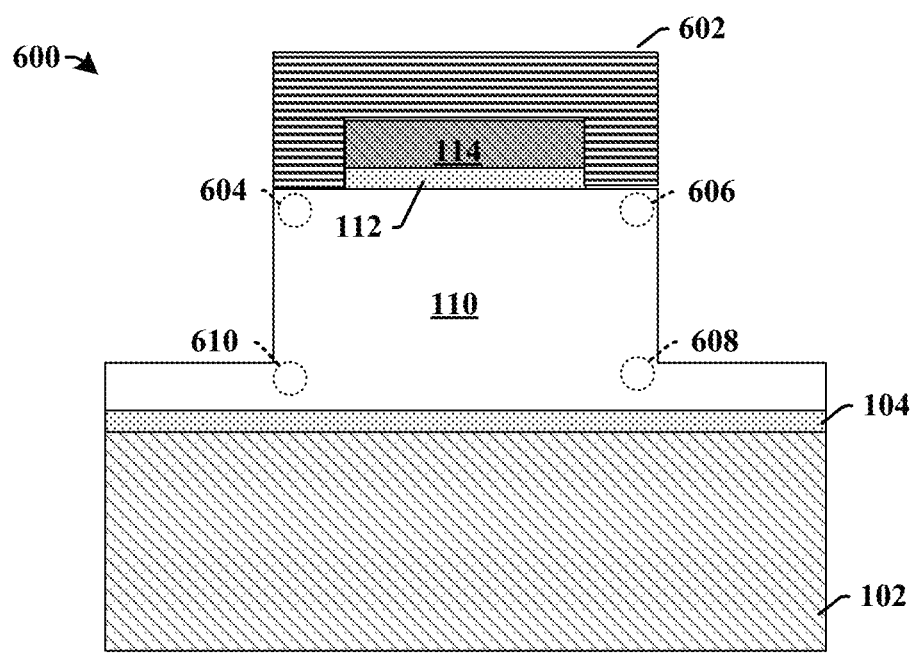

As shown in cross-sectional view 600 of FIG. 6, an additional patterned hard mask 602 is deposited over top surfaces of the gate electrode 114 and sidewalls of the gate electrode 114 and the gate oxide 112. The additional patterned hard mask 602 covers top portions of the semiconductor material 310. An etch is performed according to the additional patterned hard mask 602 such that outer, uncovered portions of the semiconductor material 310 are removed, forming a semiconductor region 110. The semiconductor region 110 comprises a first upper corner region 604, a second upper corner region 606, a first lower corner region 608 and a second lower corner region 610. The first upper corner region 604 is laterally spaced from the second upper corner region 606, and likewise, the first lower corner region 608 is laterally spaced from the second lower corner region 610. The first upper corner region 604 overlies and is vertically spaced from the second lower corner region 610, and the second upper corner region 606 overlies and is vertically spaced from the first lower corner region 608. The etch stops before the bulk oxide 104 is exposed, leaving peripheral portions of the semiconductor region 110 beside a protruding central portion of the semiconductor region 110.

Figure 7:
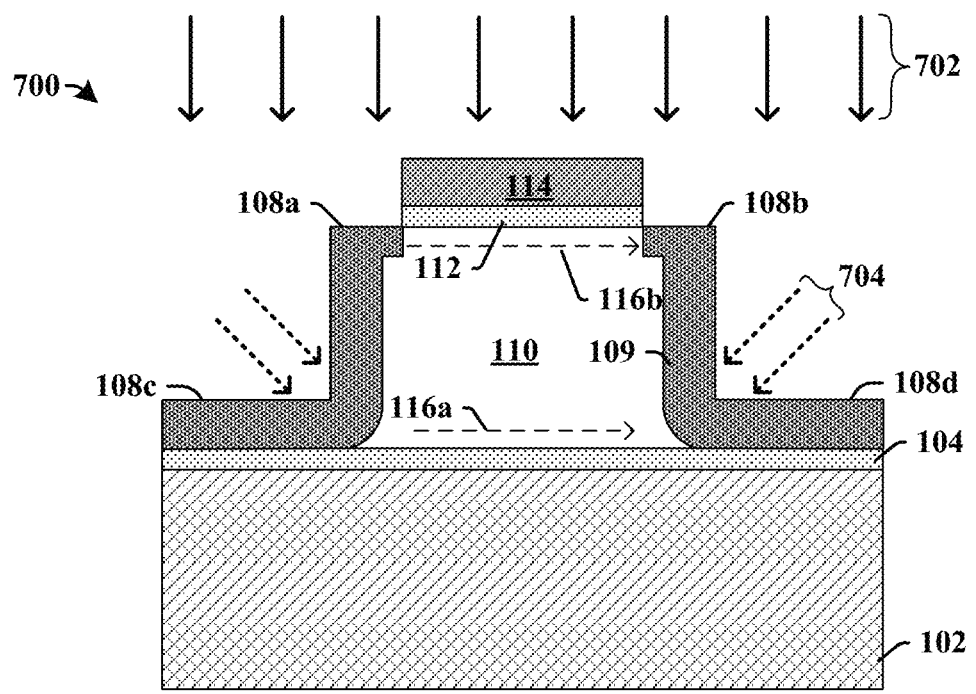

As shown in cross-sectional view 700 of FIG. 7, in some embodiments, a vertical ion implantation 702 and/or an angled ion implantation 704 are performed to dope regions of the semiconductor region 110. The vertical ion implantation 702 and the angled ion implantation 704 form an upper source region 108*a*, an upper drain region 108*b*, a lower source region 108*c*, and a lower drain region 108*d* having a second doping type (e.g., n-type or p-type) different than the first doping type. A first channel region 116*a* is within the semiconductor region, between the lower source region 108*c* and the lower drain region 108*d*, and above the bulk oxide 104. A second channel region 116*b* is within the semiconductor region, between the upper source region 108*a* and the upper drain region 108*b*, and below the gate oxide 112. The vertical and/or angled ion implantations 702, 704 are conducted such that the length of the first channel region 116*a* is substantially equal to the length of the second channel region 116*b*. The length of the first channel region 116*a* and the second channel region 116*b* may be in a range of between approximately 0.3 micrometers and approximately 2 micrometers. The angled ion implantation 704 is conducted at an angle that reduces the length of the first channel region 116*a* to be more equal in length to the first channel region 116*a*. As a result, residual source/drain areas 109 may form, connecting the upper source region 108*a* to the lower source region 108*c* and the upper drain region 108*b* to the lower drain region 108*d*. If a purely vertical ion implantation is used, residual source/drain areas 109 may be omitted, such that the upper source and drain regions 108*a*, 108*b* are respectively spaced apart from the lower source and drain regions 108*c*, 108*d*.

Figure 8:
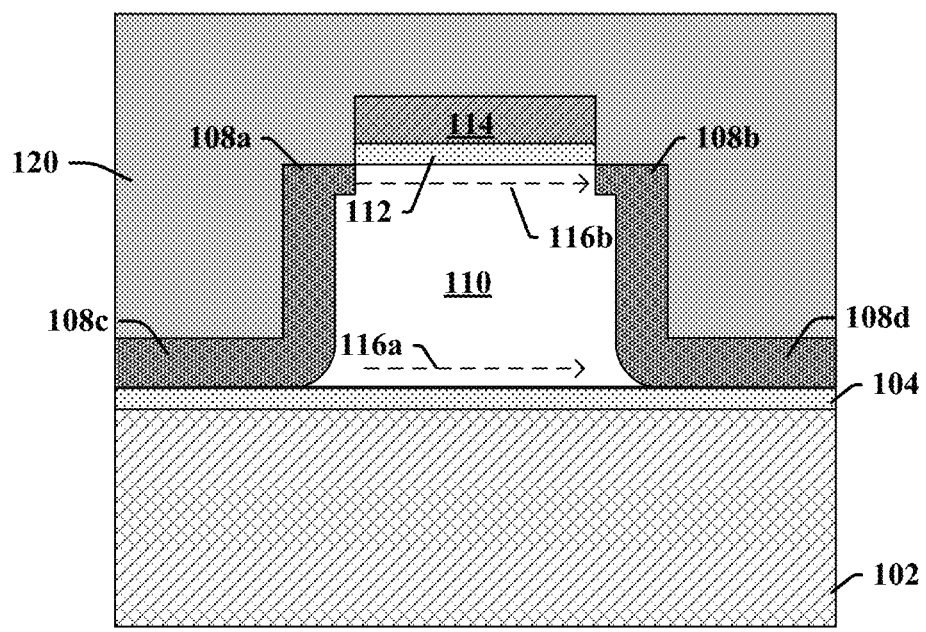

As shown in cross-sectional view 800 of FIG. 8, one or more inter-layer dielectric (ILD) layers 120 (e.g., an oxide, a low-k dielectric, or an ultra low-k dielectric) are disposed over the embodiment in cross-sectional view 700.

Figure 9:
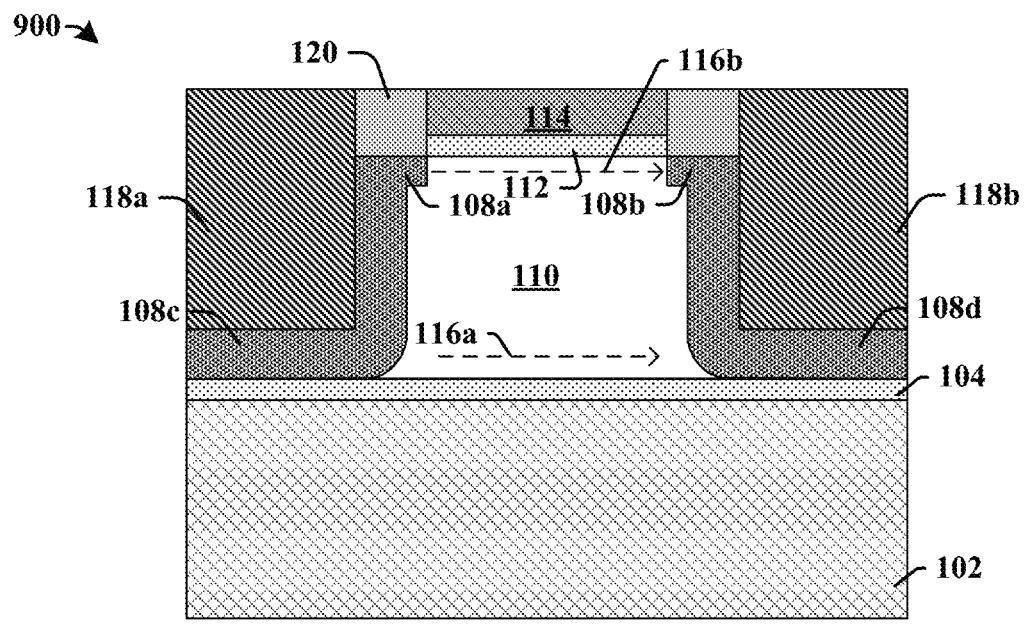

As shown in cross-sectional view 900 of FIG. 9, a source metal contact 118*a* and a drain metal contact 118*b* are formed. In some embodiments (not shown), silicide layers may be formed over the upper source region 108*a*, the lower source region 108*c*, the upper drain region 108*b*, and the lower drain region 108*d* before the formation of the source/drain metal contacts 118*a*, 118*b*. The source/drain metal contacts 118*a*, 118*b* may be formed by a damascene process and comprise a conductive metal, such as aluminum or copper, for example. The source/drain metal contacts are spaced from the gate electrode 114 and gate oxide 112 by the one or more ILD layers 120.

Figure 10:
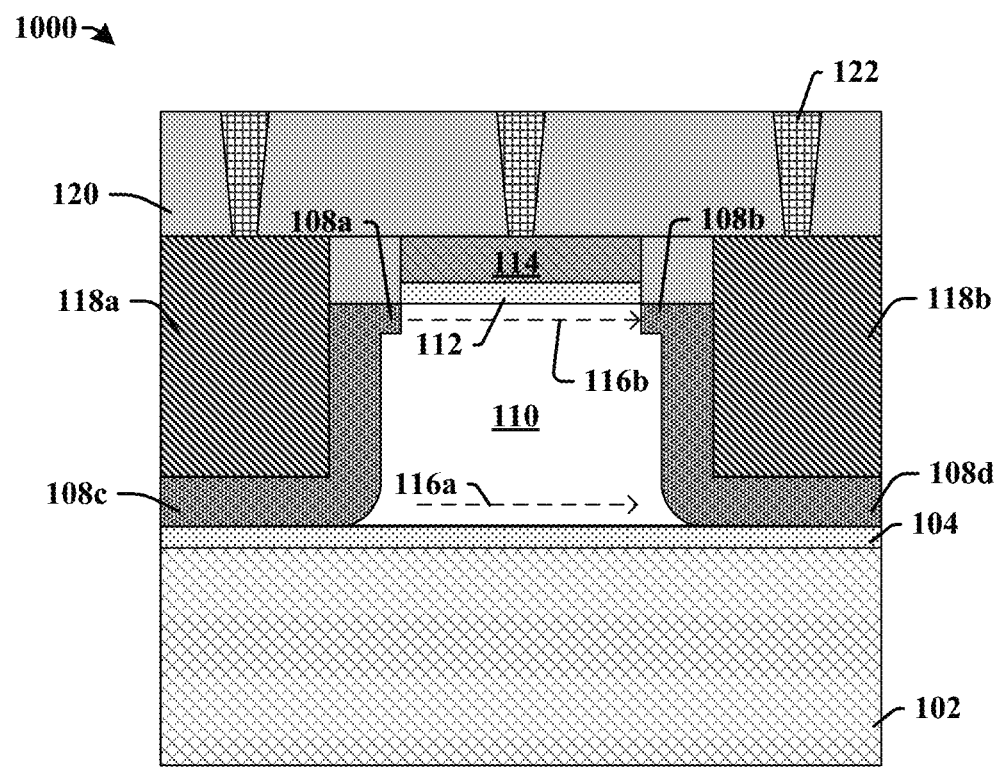

As shown in cross-sectional view 1000 of FIG. 10, one or more ILD layers 120 are formed over the source/drain metal contacts 118*a*, 118*b*, and contact vias 122 are formed within the one or more ILD layers 120. The contact vias 122 may be formed using a damascene process. Contact vias 122 are formed on the source/drain metal contacts 118*a*, 118*b* and on the gate electrode 114.

Figure 11:
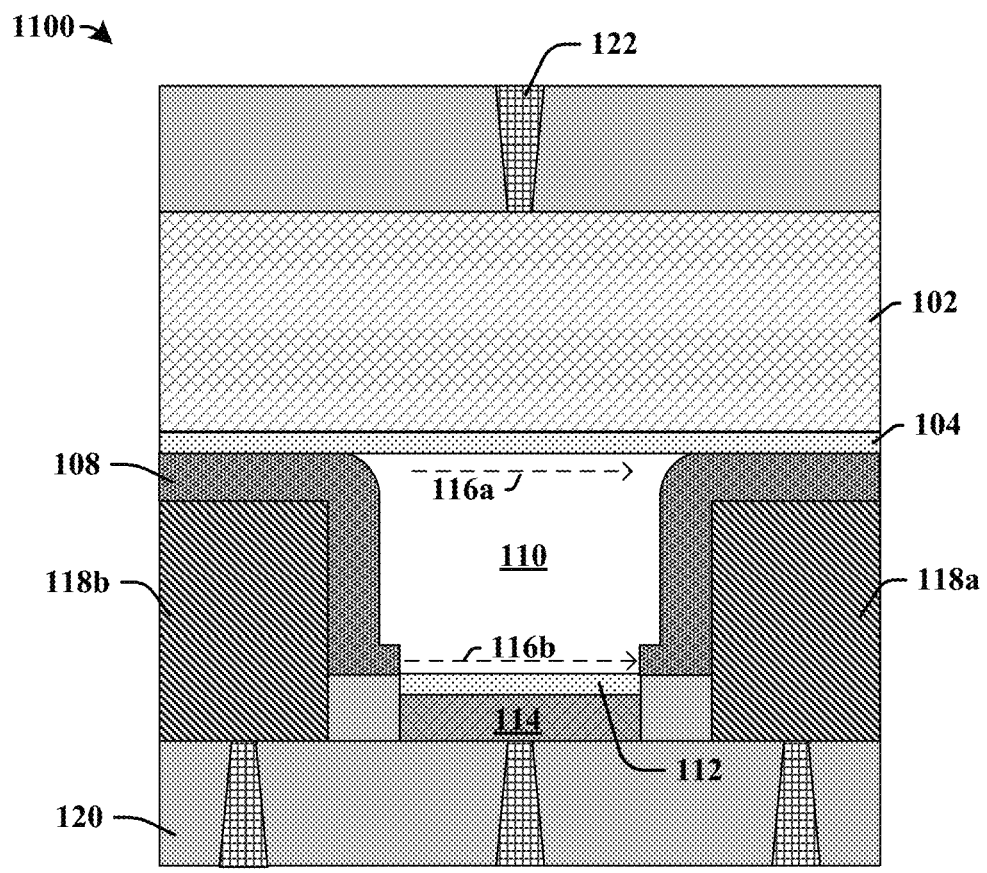

As shown in cross-sectional view 1100 of FIG. 11, one or more ILD layers 120 are deposited on a backside of the semiconductor substrate 102 and a contact via 122 is formed within the one or more ILD layers 120 and electrically coupled to the semiconductor substrate 102. To pattern the backside of the semiconductor substrate 102, the embodiment may be flipped over during manufacturing. Through the contact vias 122 and additional interconnect metal wiring embedded in the one or more ILD layers, the source metal contact 118*a* is coupled to a source voltage line $V_S$; the drain metal contact 118*b* is coupled to a drain voltage line $V_D$; and the gate electrode 114 and the semiconductor substrate 102 are coupled to the gate voltage line $V_G$, as shown in the cross-sectional view 100B of FIG. 1B. Before depositing the one or more ILD layers 120 on the backside of the semiconductor substrate 102, the semiconductor substrate 102 may be patterned and a back gate electrode 103 may be deposited along the first channel region 116*a*, resulting in the back gate electrode 103 illustrated in cross-sectional view 100C of FIG. 1C, for example. The back gate electrode 103 may also extend into a portion of the bulk oxide 104 such that the bulk oxide 104 adjacent to the first channel region 116*a* has the same thickness as the gate oxide 112 adjacent to the second channel region 116*b*. In many embodiments, the back gate electrode 103 consists of the same material as the gate electrode 114.

Figure 12:
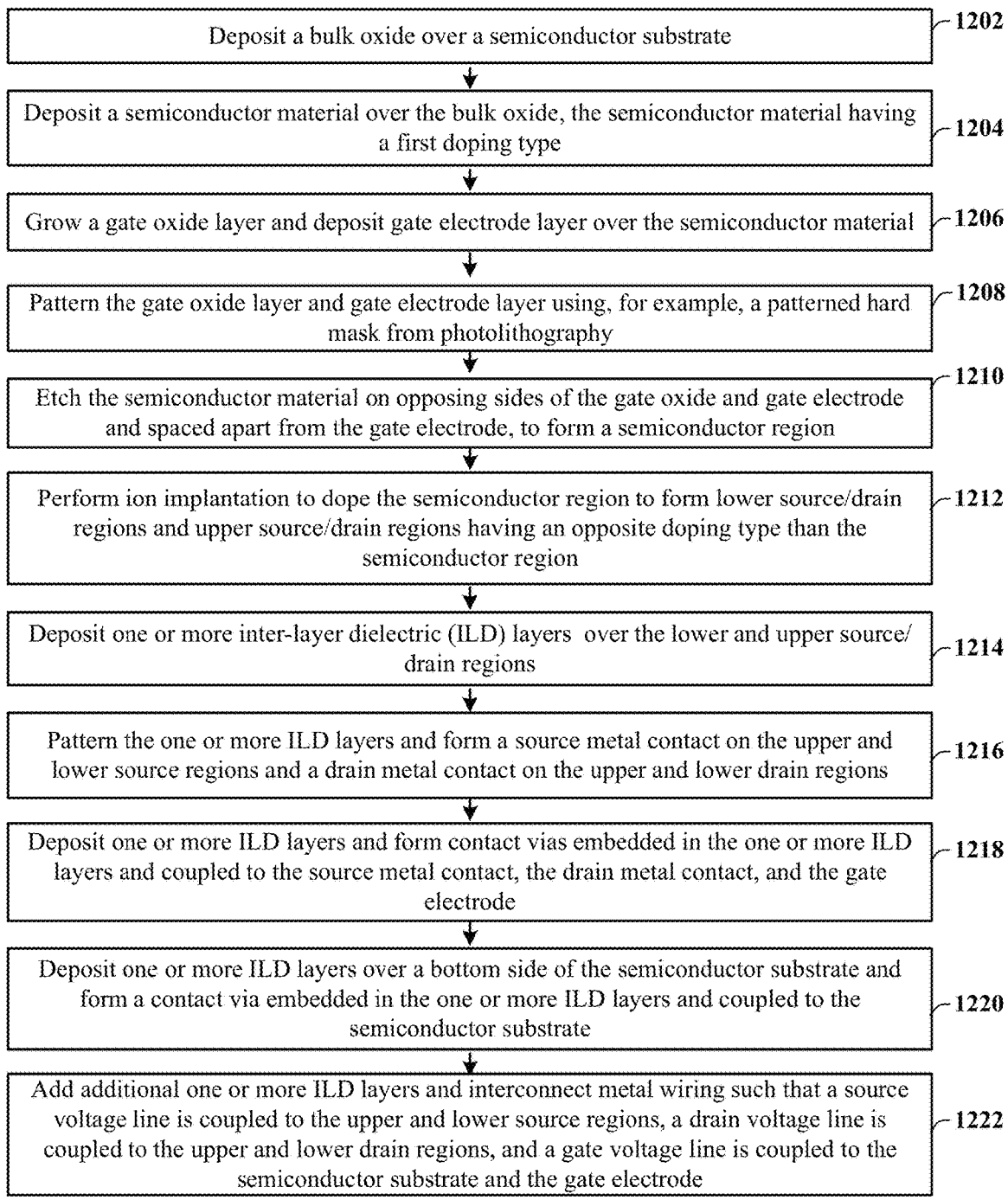
FIG. 12 illustrates a flow diagram of some embodiments of a method of forming an integrated chip having a transistor comprising two channel regions.

FIG. 12 illustrates a flow diagram of some embodiments of a method 1200 of forming an integrated chip having a transistor that comprises two channel regions.

While method 1200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1202, a bulk oxide is deposited over a semiconductor substrate.

At 1204, a semiconductor material is deposited over the bulk oxide and has a first doping type, thereby providing an SOI wafer. FIG. 3 illustrates a cross-sectional view 300 of some embodiments corresponding to acts 1202 and 1204.

At 1206, a gate oxide layer is grown over the semiconductor material and a gate electrode layer is deposited over the gate oxide layer. FIG. 4 illustrates a cross-sectional view 400 of some embodiments corresponding to act 1206.

At 1208, the gate oxide layer and the gate electrode layer are patterned using, for example, a patterned hard mask from photolithography. FIG. 5 illustrates a cross-sectional view 500 of some embodiments corresponding to act 1208.

At 1210, the semiconductor material is etched on opposing sides of the gate oxide and the gate electrode, while spaced apart from the gate electrode, to form a semiconductor region. FIG. 6 illustrates a cross-sectional view 600 of some embodiments corresponding to act 1210.

At 1212, ion implantation is performed to dope the semiconductor region to form lower source/drain regions and upper source/drain regions having an opposite doping type than the semiconductor region. FIG. 7 illustrates a cross-sectional view 700 of some embodiments corresponding to act 1212.

At 1214, one or more inter-layer dielectric (ILD) layers are deposited over the lower and upper source/drain regions. FIG. 8 illustrates a cross-sectional view 800 of some embodiments corresponding to act 1214.

At 1216, the one or more ILD layers are patterned, and a source metal contact on the upper and lower source regions and a drain metal contact on the upper and lower drain regions are formed. FIG. 9 illustrates a cross-sectional view 900 of some embodiments corresponding to act 1216.

At 1218, one or more ILD layers are deposited, and contact vias are formed. The contact vias are embedded in the one or more ILD layers and coupled to the source metal contact, the drain metal contact, and the gate electrode. FIG. 10 illustrates a cross-sectional view 1000 of some embodiments corresponding to act 1218.

At 1220, on a bottom side of the semiconductor substrate, one or more ILD layers are deposited. A contact via is embedded in the one or more ILD layers and coupled to the semiconductor substrate. FIG. 11 illustrates a cross-sectional view 1100 of some embodiments corresponding to act 1220.

At 1222, additional one or more ILD layers and interconnect metal wiring are added such that a source voltage line is coupled to the upper and lower source regions, a drain voltage line is coupled to the upper and lower drain regions, and a gate voltage line is coupled to the semiconductor substrate and the gate electrode. FIG. 1B illustrates a cross-sectional view 100B of some embodiments corresponding to act 1222.

FIGS. 13-22 illustrate cross-sectional views 1300-2200 of some embodiments of a method of forming an integrated chip having a transistor comprising four channel regions. Although FIGS. 13-22 are described in relation to a method, it will be appreciated that the structures disclosed in FIGS. 13-22 are not limited to such a method, but instead may stand alone as structures independent of the method.

Figure 13:
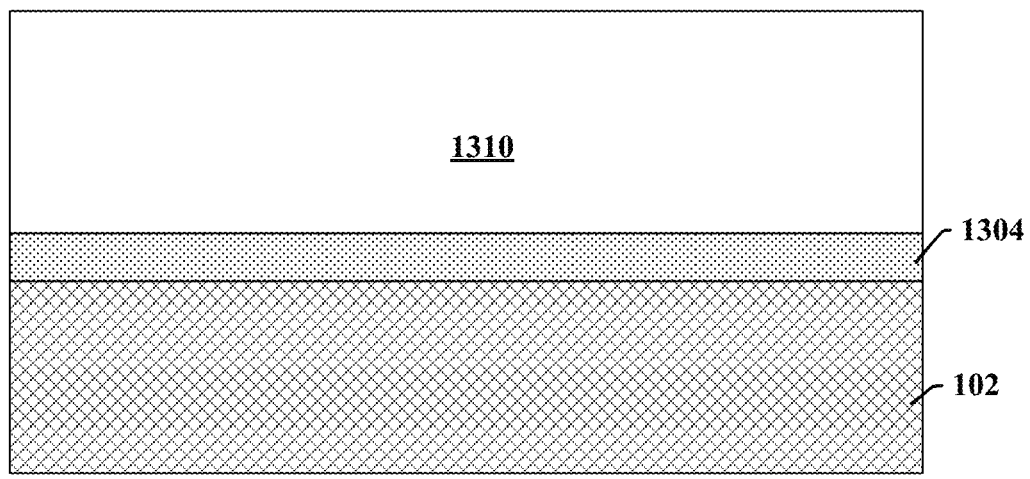
FIGS. 13-22 illustrate cross-sectional views of some additional embodiments of a method of forming an integrated chip having a transistor comprising four channel regions.

As shown in cross-sectional view 1300 of FIG. 13, a silicon-on-insulator (SOI) substrate is provided, comprising a semiconductor material 1310 disposed over a bulk oxide layer 1304 which is disposed over a semiconductor substrate 102. In many embodiments, the semiconductor substrate 102 may comprise monocrystalline silicon. In some embodiments, additional processing steps may be conducted such that the semiconductor substrate 102 is doped. The semiconductor material 1310 has a first doping type (e.g., n-type or p-type).

Figure 14:
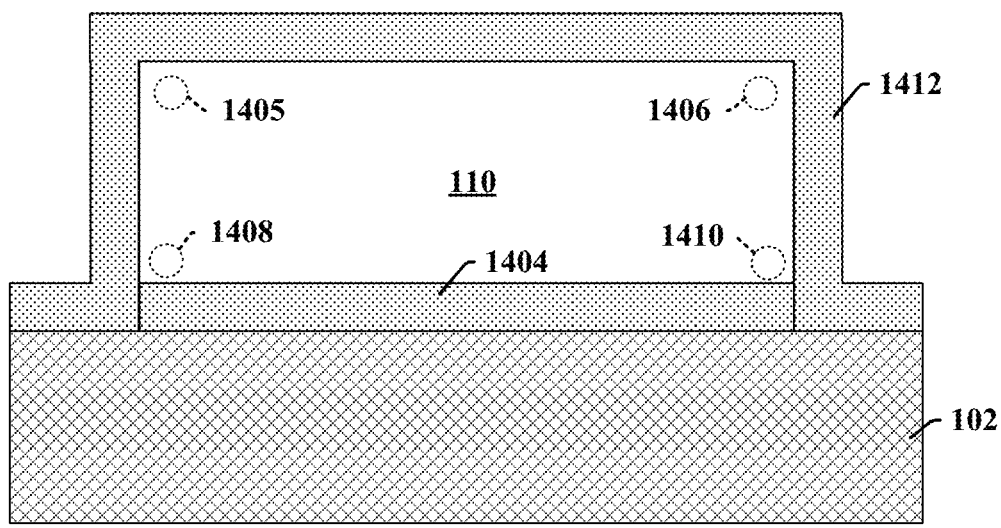

As shown in cross-sectional view 1400 of FIG. 14, in some embodiments, the semiconductor material 1310 is patterned to form a semiconductor region 110, where peripheral portions of the semiconductor material 1310 and the bulk oxide layer 1304 are removed, leaving the semiconductor region 110 and the patterned bulk oxide 1404. In some embodiments (not shown), to form the semiconductor region 110, a mask formed by photolithography and an etch (e.g., dry etch or wet etch) may be used. The mask is formed to cover a central portion of the semiconductor material 1310 such that the etch removes uncovered, peripheral portions of the semiconductor material 1310. The semiconductor region 110 comprises a first upper corner region 1405, a second upper corner region 1406, a first lower corner region 1408 and a second lower corner region 1410. The first upper corner region 1405 is laterally spaced from the second upper corner region 1406, and likewise, the first lower corner region 1408 is laterally spaced from the second lower corner region 1410. The first upper corner region 1405 overlies and is vertically spaced from the first lower corner region 1408, and the second upper corner region 1406 overlies and is vertically spaced from the second lower corner region 1410. Then, a gate oxide layer 1412 is grown over the semiconductor region 110. The gate oxide layer 1412 covers a top surface of the semiconductor region 110, sidewalls of the semiconductor region 110, and sidewalls of the patterned bulk oxide 1404. In many embodiments, the gate oxide layer 1412 is made of the same material and grown to the same thickness as the patterned bulk oxide 1404. The gate oxide layer 1412 is often grown by a thermal oxidation process at high temperatures.

Figure 15:
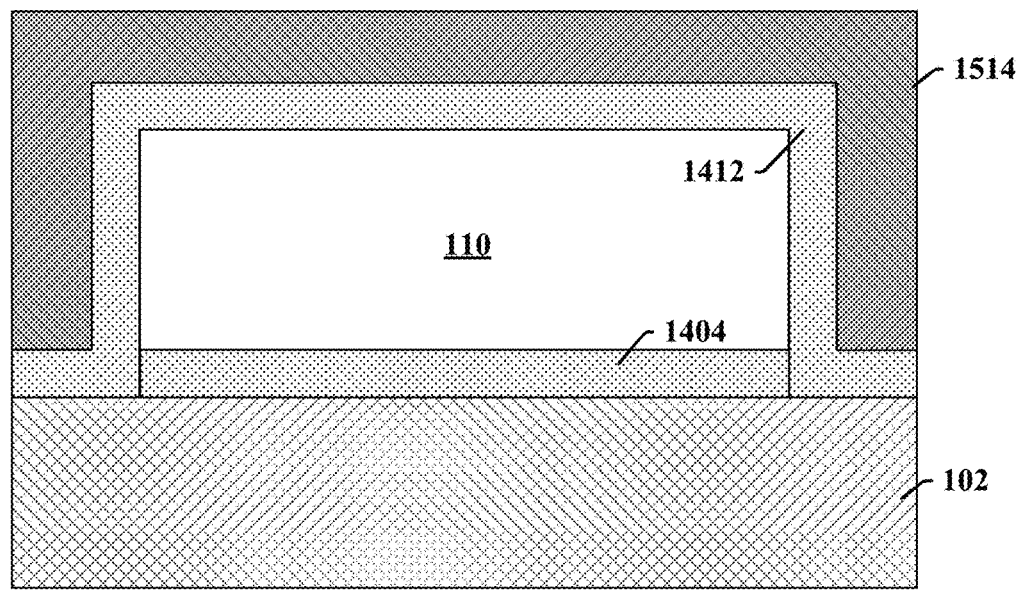

As shown in cross-sectional view 1500 of FIG. 15, a conformal gate electrode layer 1514 is deposited over the gate oxide layer 1412. The conformal gate electrode layer 1514 may comprise doped polysilicon. In some embodiments, the conformal gate electrode layer 1514 may comprise the same doping concentration as the semiconductor substrate 102.

Figure 16:
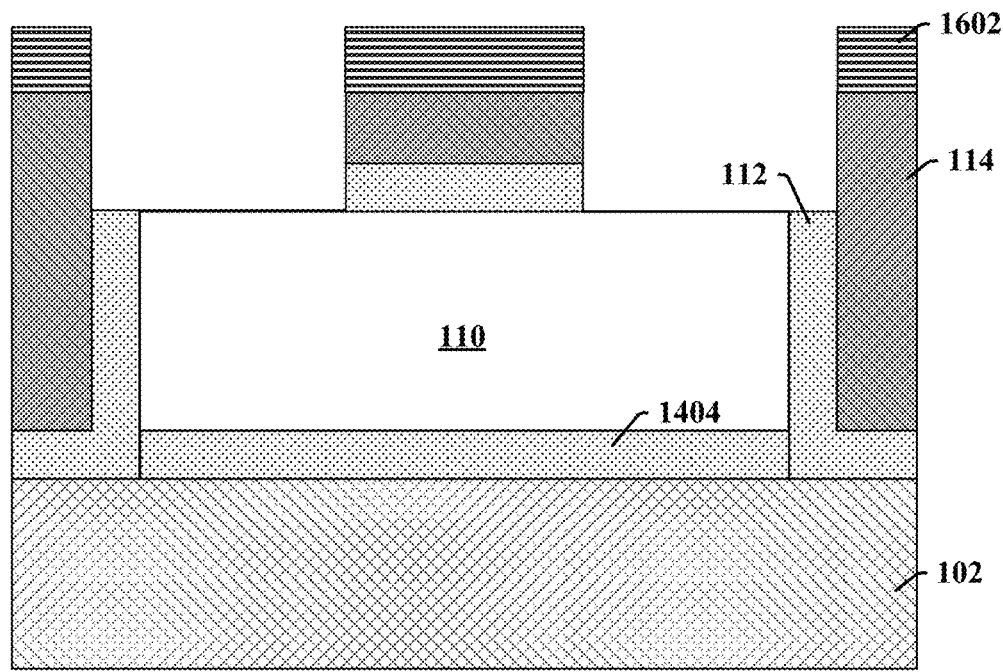

As shown in cross-sectional view 1600 of FIG. 16, a patterned mask 1602 is formed over portions of the conformal gate electrode layer 1514 to etch (e.g., wet etch or dry etch) the conformal gate electrode layer 1514 and the gate oxide layer 1412 to form a gate electrode 114 and a gate oxide 112. The gate electrode 114 and the gate oxide 112 have peripheral portions along sidewalls of the semiconductor region 110 and central portions along a center top surface of the semiconductor region 110.

Figure 17:
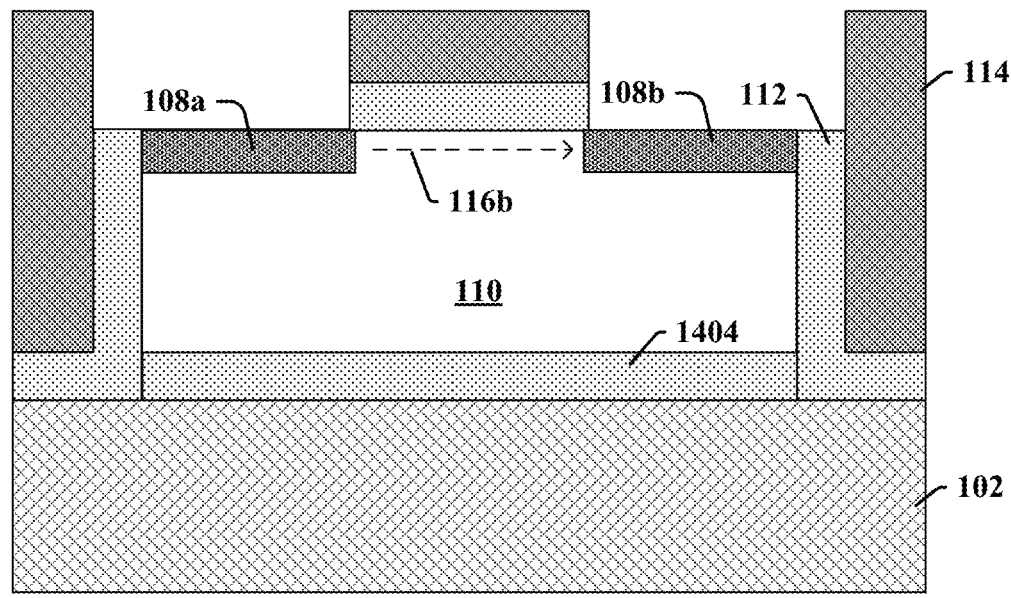

As shown in cross-sectional view 1700 of FIG. 17, an upper source region 108a and an upper drain region 108b are formed. The upper source region 108a and the upper drain region 108b are formed by doping the exposed portions of the semiconductor region 110 that are between the peripheral portions and central portion of the gate oxide 112. The upper source region 108a and the upper drain region 108b have a second doping type that is opposite to the first doping type of the semiconductor region 110. The upper source/drain regions 108a, 108b may be formed by a vertical ion implantation technique. The upper source/drain regions may extend partially under the gate oxide 112 due to residual effects from the vertical ion implantation technique. The space between the upper source region 108a and the upper drain region 108b that is within the semiconductor region 110 and below the central portion of the gate oxide 112 is where a second channel region 116b resides. The length of the second channel region 116b may be in the range of between approximately 0.3 micrometers and approximately 2 micrometers.

Figure 18:
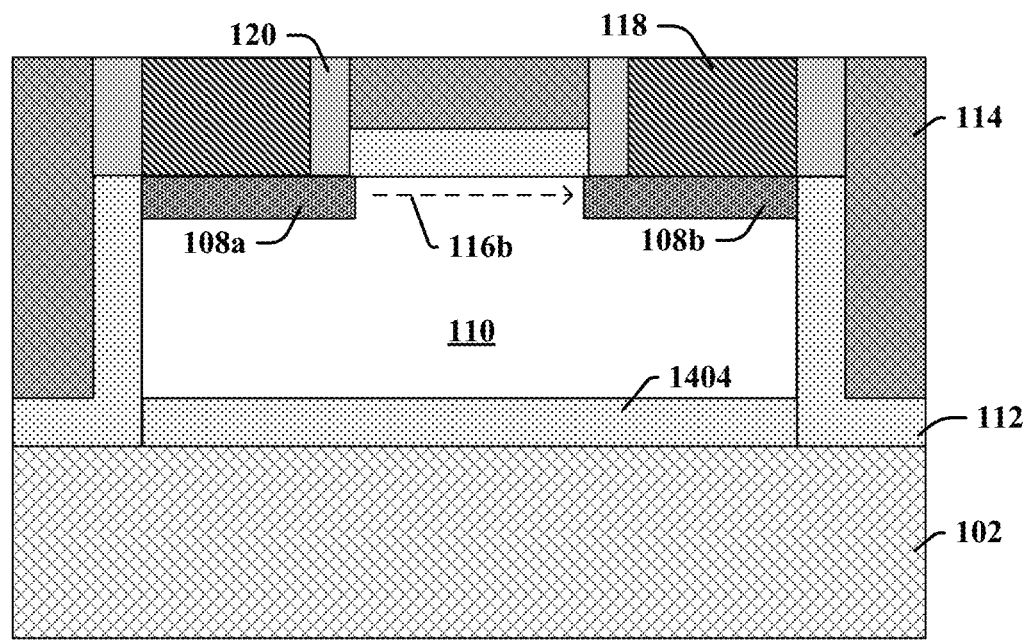

As shown in cross-sectional view 1800 of FIG. 18, metal contacts 118 are formed within one or more inter-layer dielectric (ILD) layers 120 over the upper source region 108a and the upper drain region 108b. The metal contacts 118 are conductive and may be formed by a damascene process. Upper surfaces of the metal contacts 118, the gate electrode 114, the gate oxide 112 and the one or more ILD layers 120 may be substantially coplanar. The metal contacts 118 are spaced from the gate electrode 114 by the one or more ILD layers 120.

Figure 19:
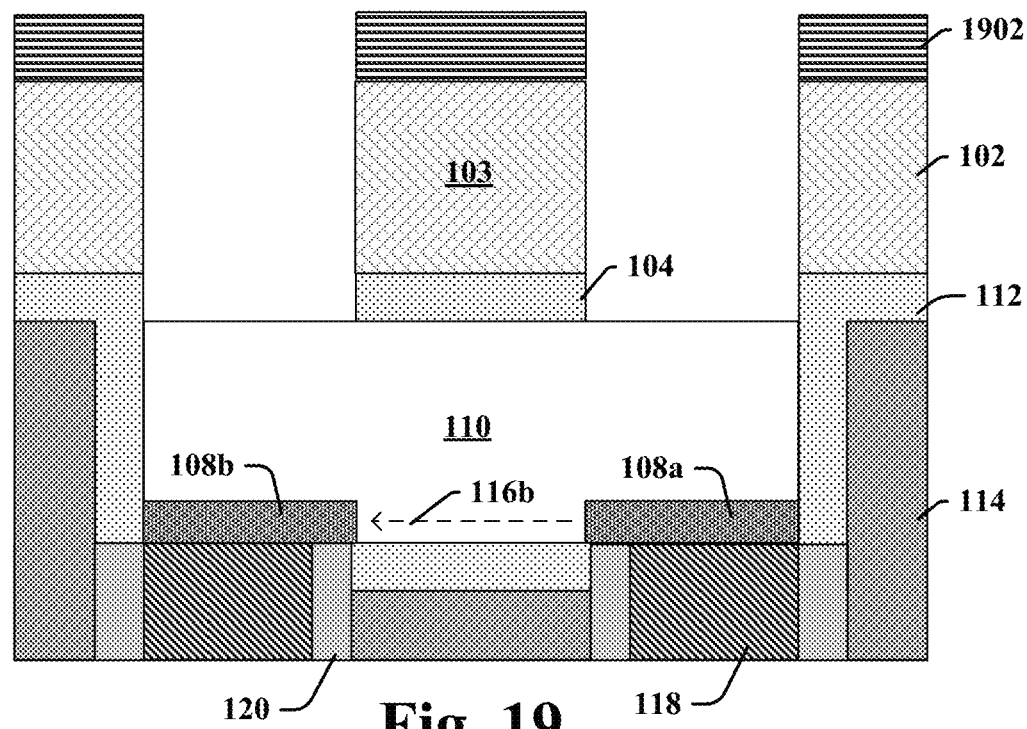

As shown in cross-sectional view 1900 of FIG. 19, the SOI substrate is flipped over, and a backside of the semiconductor substrate 102 is patterned to form a back gate electrode 103. A patterned mask 1902 is formed over the semiconductor substrate, and an etch (e.g., wet etch or dry etch) is performed such that the back gate electrode 103 is substantially overlying the center portion of the gate oxide 112. The bulk oxide layer 1404 is also patterned with the semiconductor substrate 102 to form a bulk oxide 104.

Figure 20:
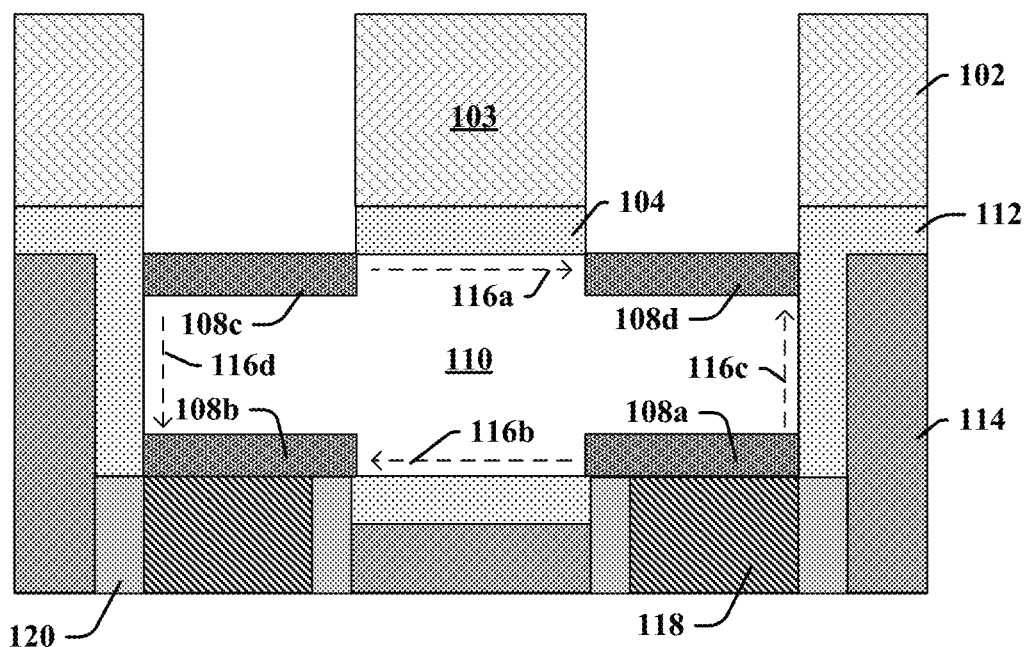

As shown in cross-sectional view 2000 of FIG. 20, the patterned mask 1902 is removed, and a lower source region 108c and a lower drain region 108d are formed within the semiconductor region 110. Similar to the formation of the upper source/drain regions 108a, 108b, a vertical ion implantation process may be performed to form the lower source/drain regions 108c, 108d. Just like the second channel region 116b, the space between the lower source region 108c and the lower drain region 108d that is within the semiconductor region 110 and below the bulk oxide 104 is where a first channel region 116a resides. The lower source region 108c is formed to overlie the upper drain region 108b, and the lower drain region 108d is formed to overlie the upper source region 108a. A third channel region 116c is defined by the space between the upper source region 108a and the lower drain region 108d that is beside a peripheral portion of the gate oxide 112 and within the semiconductor region 110. A fourth channel region 116d is defined by the space between the upper drain region 108b and the lower source region 108c that is beside a different peripheral portion of the gate oxide 112 and within the semiconductor region 110. The channel regions 116a-116d have lengths that are substantially equal to one another. The length of each channel region 116a-116d may be in a range of between approximately 0.3 micrometers and 2 micrometers.

Figure 21:
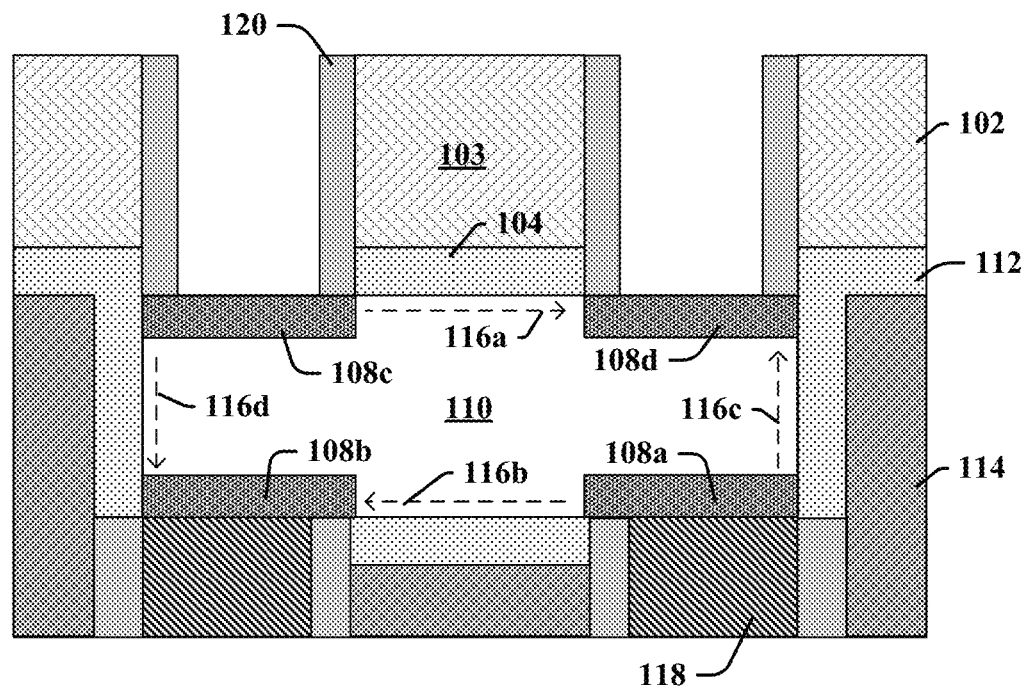

As shown in cross-sectional view 2100 of FIG. 21, one or more ILD layers 120 are disposed along sidewalls of the semiconductor substrate 102, the back gate electrode 103, the bulk oxide 104 and the gate oxide 112, while leaving portions of the lower source/drain regions 108c, 108d uncovered.

Figure 22:
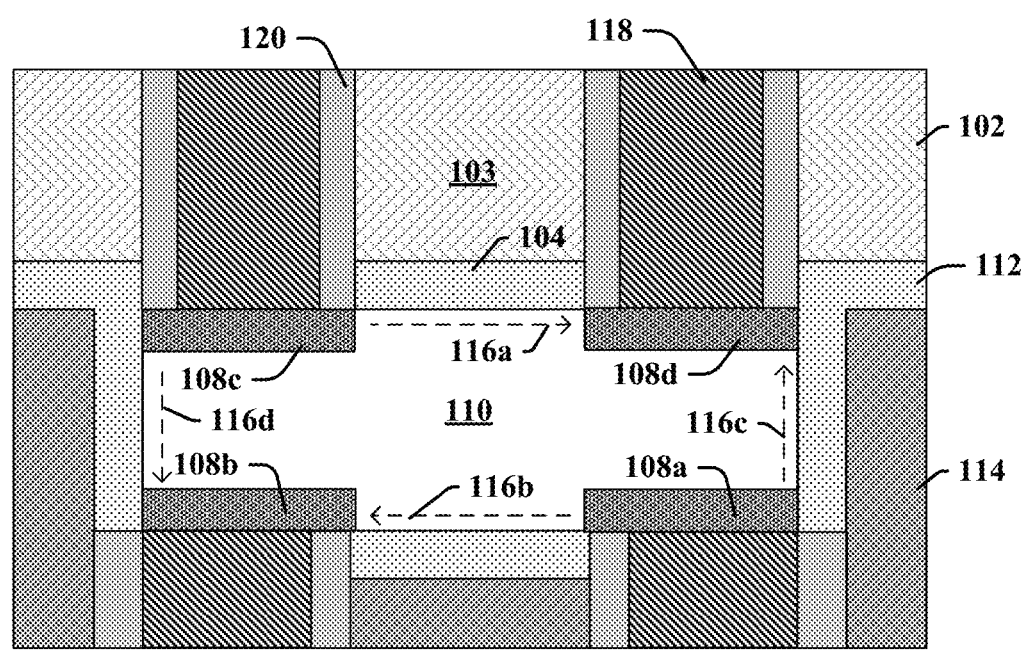

As shown in cross-sectional view 2200 of FIG. 22, metal contacts 118 are deposited within the space between the one or more ILD layers 120 and the lower source/drain regions 108c, 108d, such that the lower source region 108c and the lower drain region 108d are each coupled to one of the metal contacts 118. Through contact vias 122 and additional interconnect metal wiring embedded in the one or more ILD layers 120, the upper and lower source regions 108a, 108c are coupled to a source voltage line $V_S$; the upper and lower drain regions 108b, 108d are coupled to a drain voltage line $V_D$; and the gate electrode 114 and the back gate electrode 103 are coupled to the gate voltage line $V_G$, as shown in the cross-sectional view 200A of FIG. 2A. In some embodiments, the back gate electrode 103 at FIG. 22 consists of a different material than the gate electrode 114. In the aforementioned embodiments, before depositing the one or more ILD layers 120 over the back gate electrode 103 and the semiconductor substrate 102, the back gate electrode 103 may be removed and replaced with a back gate electrode 103 having the same material as the gate electrode 114. The resulting embodiment is illustrated in cross-sectional view 200B of FIG. 2B. During the back gate electrode 103 removal, portions of the bulk oxide 104 may also be removed such that the thickness of the bulk oxide 104 is equal to the thickness of the gate oxide 112.

Figure 23:
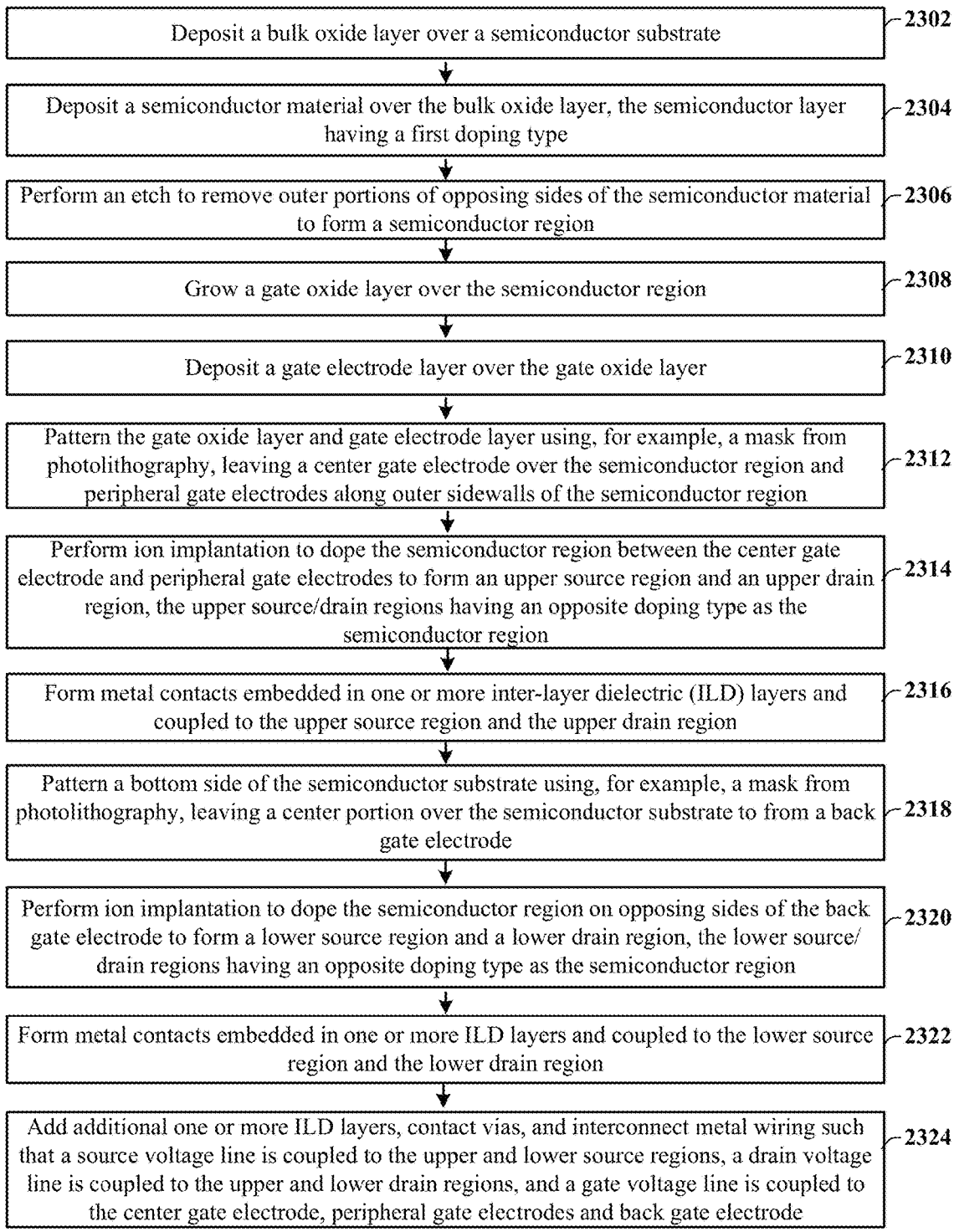
FIG. 23 illustrates an additional flow diagram of some additional embodiments of a method of forming an integrated chip having a transistor comprising four channel regions.

FIG. 23 illustrates a flow diagram of some embodiments of a method 2300 of forming an integrated chip having a transistor that comprises four channel regions 116a-116b.

While method 2300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2302, a bulk oxide layer is deposited over a semiconductor substrate.

At 2304, a semiconductor material is deposited over the bulk oxide layer. The semiconductor material has a first doping type. FIG. 13 illustrates a cross-sectional view 1300 of some embodiments corresponding to acts 2302 and 2304.

At 2306, an etch is performed to remove outer portions of opposing sides of the semiconductor material to form a semiconductor region.

At 2308, a gate oxide layer is grown over the semiconductor region. FIG. 14 illustrates a cross-sectional view 1400 of some embodiments corresponding to acts 2306 and 2308.

At 2310, a gate electrode layer is deposited over the gate oxide layer. FIG. 15 illustrates a cross-sectional view 1500 of some embodiments corresponding to act 2310.

At 2312, the gate oxide layer and the gate electrode layer are patterned using, for example, a mask from photolithography. After patterning, a center gate electrode and peripheral gate electrodes are left, respectively over the semiconductor region and along outer sidewalls of the semiconductor region. FIG. 16 illustrates a cross-sectional view 1600 of some embodiments corresponding to act 2312.

At 2314, ion implantation is performed to dope the semiconductor region between the center gate electrode and peripheral gate electrodes to form an upper source region and an upper rain region. The upper source/drain regions have opposite doping types as the semiconductor region. FIG. 17 illustrates a cross-sectional view 1700 of some embodiments corresponding to act 2314.

At 2316, metal contacts are formed embedded within one or more inter-layer dielectric (ILD) layers and coupled to the upper source region and the upper drain region. FIG. 18 illustrates a cross-sectional view 1800 of some embodiments corresponding to act 2316.

At 2318, a bottom side of the semiconductor substrate is patterned using, for example, a mask from photolithography. After patterning, a center portion of the semiconductor substrate forms a back gate electrode. FIG. 19 illustrates a cross-sectional view 1900 of some embodiments corresponding to act 2318.

At 2320, ion implantation is performed to dope the semiconductor region on opposing sides of the back gate electrode to form a lower source region and a lower drain region. The lower source/drain regions have opposite doping types than the semiconductor region. FIG. 20 illustrates a cross-sectional view 2000 of some embodiments corresponding to act 2320.

At 2322, metal contacts embedded in one or more ILD layers are formed. The metal contacts are coupled to the lower source region and the lower drain region. FIGS. 21-22 illustrate cross-sectional views 2100, 2200 of some embodiments corresponding to act 2322.

At 2324, additional one or more ILD layers, contact vias, and interconnect metal wirings are added such that a source voltage line is coupled to the upper and lower source regions, a drain voltage line is coupled to the upper and lower drain regions, and a gate voltage line is coupled to the center gate electrode, peripheral gate electrode, and back gate electrode. FIG. 2A illustrates a cross-sectional view 200A of some embodiments corresponding to act 2324.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Therefore, the present disclosure relates to a new structure and method of manufacturing of a transistor to reduce resistance from the source to drain when the transistor is on ($R_{DS(on)}$) by having more than one channel region.

Accordingly, in some embodiments, the present disclosure relates to a semiconductor device comprising a bulk oxide disposed over a semiconductor substrate; a semiconductor region disposed over the bulk oxide; a lower source region and a lower drain region, wherein the lower source region and the lower drain region are above and directly contact the bulk oxide and are laterally spaced apart by a lower portion of the semiconductor region; an upper source region coupled to the lower source region and an upper drain region coupled to the lower drain region, wherein the upper source region is laterally spaced from the upper drain region by an upper portion of the semiconductor region, and wherein the upper source region and the upper drain region are vertically spaced from the lower source region and the lower drain region; a gate oxide disposed over the upper portion of the semiconductor region; a gate electrode disposed directly above the gate oxide, the gate electrode being coupled to the semiconductor substrate; a first channel region within the lower portion of the semiconductor region, above the bulk oxide, and between the lower source region and the lower drain region; and a second channel region within the upper portion of the semiconductor region, below the gate oxide, and between the upper source region and the upper drain region, wherein the second channel region is parallel to the first channel region.

In other embodiments, the present disclosure relates to a semiconductor device comprising a bulk oxide disposed over a semiconductor substrate; a semiconductor region disposed over the bulk oxide; a lower source region and a lower drain region, wherein the lower source region and the lower drain region are above the bulk oxide and spaced apart by a lower portion of the semiconductor region; a first channel region above the bulk oxide, within the lower portion of the semiconductor region, and laterally between the lower source region and the lower drain region; a gate oxide disposed over an upper portion of the semiconductor region, wherein a second channel region is below the gate oxide and within the upper portion of the semiconductor region; a gate electrode disposed directly above the gate oxide, the gate electrode being coupled to the semiconductor substrate; an upper source region coupled to the lower source region, overlying the lower drain region, and vertically spaced from the lower drain region by a third channel region within the semiconductor region; an upper drain region coupled to the lower drain region, overlying the lower source region, and vertically spaced from the lower source region by a fourth channel region within the semiconductor region, wherein the upper source region is laterally spaced from the upper drain region by the second channel region; a first peripheral gate electrode arranged adjacent to the upper source region and the lower drain region and spaced from the third channel region by a first peripheral gate oxide, wherein the first peripheral gate electrode is coupled to the semiconductor substrate; and a second peripheral gate electrode arranged adjacent to the upper drain region and the lower source region and spaced from the fourth channel region by a second peripheral gate oxide, wherein the second peripheral gate electrode is coupled to the semiconductor substrate.

In yet other embodiments, the present disclosure relates to a method of forming a semiconductor device, comprising providing a silicon-on-insulator substrate comprising a bulk oxide disposed over a semiconductor substrate and a semiconductor region disposed over the bulk oxide, wherein the semiconductor region has a first doping type; forming a gate oxide layer over the semiconductor region; forming a gate electrode layer over the gate oxide layer; patterning the gate oxide layer and the gate electrode layer using a mask, leaving a gate oxide and gate electrode over a first portion of the semiconductor region and leaving a second portion of the semiconductor region uncovered, wherein the semiconductor region comprises corner regions comprising a first upper corner region laterally spaced from a second upper corner region and a first lower corner region laterally spaced from a second lower corner region, and wherein the first and second lower corner regions are vertically spaced from the first and second upper corner regions by portions of the semiconductor region; performing ion implantation to dope the corner regions of the semiconductor region such that the corner regions have a second doping type different than the first doping type, wherein performing the ion implantation forms an upper source region, an upper drain region, a lower drain region, and a lower source region, respectively arranged in the first upper corner region, the second upper corner region, the first lower corner region, and the second lower corner region; coupling the lower source region and the upper source region to a source voltage line; coupling the lower drain region and the upper drain region to a drain voltage line; and coupling the semiconductor substrate and the gate electrode to a gate voltage line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
a bulk oxide disposed over a semiconductor substrate;
a semiconductor region disposed over the bulk oxide;
a lower source region and a lower drain region, wherein the lower source region and the lower drain region are above and directly contact the bulk oxide and are laterally spaced apart by a lower portion of the semiconductor region;
an upper source region coupled to the lower source region and an upper drain region coupled to the lower drain region, wherein the upper source region is laterally spaced from the upper drain region by an upper portion of the semiconductor region, and wherein the upper source region and the upper drain region are vertically spaced from the lower source region and the lower drain region;
a gate oxide disposed over the upper portion of the semiconductor region;
a gate electrode disposed directly above the gate oxide, the gate electrode being coupled to the semiconductor substrate;
a first channel region within the lower portion of the semiconductor region, above the bulk oxide, and between the lower source region and the lower drain region; and
a second channel region within the upper portion of the semiconductor region, below the gate oxide, and between the upper source region and the upper drain region, wherein the second channel region is parallel to the first channel region.

2. The semiconductor device of claim 1, wherein the bulk oxide and the gate oxide have the same thickness and are made of the same material.

3. The semiconductor device of claim 1, wherein the first and second channel regions have the same length.

4. The semiconductor device of claim 1, wherein the lower drain region and the upper source region are arranged on a first side of the semiconductor region and wherein the lower source region and the upper drain region are arranged on a second side of the semiconductor region, the second side laterally spaced from the first side.

5. The semiconductor device of claim 4, further comprising:
a first peripheral gate electrode arranged adjacent to the upper source region and the lower drain region and spaced from the semiconductor region by a first peripheral gate oxide, wherein the first peripheral gate electrode is coupled to the gate electrode;
a second peripheral gate electrode arranged adjacent to the upper drain region and the lower source region and spaced from the semiconductor region by a second peripheral gate oxide, wherein the second peripheral gate electrode is coupled to the gate electrode;
a third channel region within the semiconductor region beside the first peripheral gate oxide and between the upper source region and the lower drain region; and
a fourth channel region beside the second peripheral gate oxide and between the upper drain region and the lower source region, wherein the fourth channel region is parallel to the third channel region, and wherein the fourth channel region is perpendicular to the first channel region.

6. The semiconductor device of claim 5, wherein the first, second, third and fourth channel regions have the same length.

7. The semiconductor device of claim 5, wherein the bulk oxide, the gate oxide, the first peripheral gate oxide and the second peripheral gate oxide have the same thickness and are made of the same material.

8. The semiconductor device of claim 5, wherein the gate electrode, the first peripheral gate electrode, and the second peripheral gate electrode have a same thickness.

9. A semiconductor device comprising:
a bulk oxide disposed over a semiconductor substrate;
a semiconductor region disposed over the bulk oxide;
a lower source region and a lower drain region, wherein the lower source region and the lower drain region are above the bulk oxide and spaced apart by a lower portion of the semiconductor region;
a first channel region above the bulk oxide, within the lower portion of the semiconductor region, and laterally between the lower source region and the lower drain region;
a gate oxide disposed over an upper portion of the semiconductor region, wherein a second channel region is below the gate oxide and within the upper portion of the semiconductor region;
a gate electrode disposed directly above the gate oxide, the gate electrode being coupled to the semiconductor substrate;
an upper source region coupled to the lower source region, overlying the lower drain region, and vertically spaced from the lower drain region by a third channel region within the semiconductor region;
an upper drain region coupled to the lower drain region, overlying the lower source region, and vertically spaced from the lower source region by a fourth channel region within the semiconductor region, wherein the upper source region is laterally spaced from the upper drain region by the second channel region;
a first peripheral gate electrode arranged adjacent to the upper source region and the lower drain region and spaced from the third channel region by a first peripheral gate oxide, wherein the first peripheral gate electrode is coupled to the semiconductor substrate; and
a second peripheral gate electrode arranged adjacent to the upper drain region and the lower source region and spaced from the fourth channel region by a second peripheral gate oxide, wherein the second peripheral gate electrode is coupled to the semiconductor substrate.

10. The semiconductor device of claim 9, wherein the first, second, third, and fourth channel regions have the same length.

11. The semiconductor device of claim 9, wherein the bulk oxide, the gate oxide, the first peripheral gate oxide, and the second peripheral gate oxide have the same thickness and are made of the same material.

12. The semiconductor device of claim 9, wherein the semiconductor substrate, the gate electrode, the first peripheral gate electrode, and the second peripheral gate electrode are made of the same material.

13. The semiconductor device of claim 9, wherein dielectric layers electrically insulate the semiconductor substrate, the gate electrode, the first peripheral gate electrode, and the second peripheral gate electrode from one another.

14. A semiconductor device comprising:
a silicon-on-insulator substrate comprising a bulk oxide layer arranged between a semiconductor substrate and a semiconductor region;
a lower source region arranged above the bulk oxide layer;
a lower drain region arranged above the bulk oxide layer and spaced apart from the semiconductor region by a first channel region of the semiconductor region;
a gate oxide arranged over the semiconductor region and along outer sidewalls of the semiconductor region;
a gate electrode arranged over the gate oxide and the semiconductor region;
an upper source region arranged above the lower drain region and spaced apart from the lower drain region by the semiconductor region, wherein a second channel region is arranged within the semiconductor region, vertically between the upper source region and the lower drain region, and laterally beside the gate oxide;
an upper drain region arranged above the lower source region and spaced apart from the lower source region by the semiconductor region, wherein a third channel region is arranged within the semiconductor region, vertically between the upper drain region and the lower source region, and laterally beside the gate oxide, and wherein a fourth channel region is arranged within the semiconductor region, laterally between the upper drain region and the upper source region, and vertically below the gate electrode;
a first peripheral gate electrode arranged laterally beside the second channel region and spaced apart from the second channel region by the gate oxide; and
a second peripheral gate electrode arranged laterally beside the third channel region and spaced apart from the third channel region by the gate oxide.

15. The semiconductor device of claim 14, wherein the upper source region is coupled to the lower source region, and wherein the upper drain region is coupled to the lower drain region.

16. The semiconductor device of claim 14, wherein the gate electrode comprises a different material than the semiconductor substrate.

17. The semiconductor device of claim 14, wherein the first, second, third, and fourth channel regions have the same length.

18. The semiconductor device of claim 14, further comprising:
   a back gate electrode arranged below the first channel region and spaced apart from the first channel region by the bulk oxide layer.

19. The semiconductor device of claim 18, wherein the gate electrode, the back gate electrode, the first peripheral gate electrode, and the second peripheral gate electrode are coupled to a same gate voltage line.

20. The semiconductor device of claim 18, wherein the gate electrode, the back gate electrode, the first peripheral gate electrode, and the second peripheral gate electrode comprise a same material.

* * * * *